(12) United States Patent
Asnaashari et al.

(10) Patent No.: US 10,592,429 B1
(45) Date of Patent: Mar. 17, 2020

(54) CACHE MANAGEMENT FOR MEMORY MODULE COMPRISING TWO-TERMINAL RESISTIVE MEMORY

(71) Applicant: Crossbar, Inc., Santa Clara, CA (US)

(72) Inventors: Mehdi Asnaashari, Danville, CA (US); Robin Sarno, Pleasanton, CA (US); Ruchirkumar D. Shah, San Jose, CA (US)

(73) Assignee: CROSSBAR, INC., Santa Clara, CA (US)

( * ) Notice: Subject to any disclaimer, the term of this patent is extended or adjusted under 35 U.S.C. 154(b) by 22 days.

(21) Appl. No.: 15/615,253

(22) Filed: Jun. 6, 2017

Related U.S. Application Data

(60) Provisional application No. 62/346,153, filed on Jun. 6, 2016.

(51) Int. Cl.
*G06F 12/08* (2016.01)
*G06F 12/1045* (2016.01)
*G06F 12/1009* (2016.01)
*G11C 11/406* (2006.01)
*G06F 12/02* (2006.01)
*G06F 12/0802* (2016.01)
*G06F 12/0815* (2016.01)

(52) U.S. Cl.
CPC ...... *G06F 12/1054* (2013.01); *G06F 12/0246* (2013.01); *G06F 12/0802* (2013.01); *G06F 12/0815* (2013.01); *G06F 12/1009* (2013.01); *G11C 11/40603* (2013.01); *H05K 2201/10651* (2013.01)

(58) Field of Classification Search
CPC .. G06F 12/08; G06F 12/0815; G06F 12/0246; G06F 12/0802; G06F 12/0238
USPC .......................................................... 711/113
See application file for complete search history.

(56) References Cited

U.S. PATENT DOCUMENTS

| 8,812,933 | B2 | 8/2014 | Joo et al. | |
|---|---|---|---|---|
| 2005/0177679 | A1* | 8/2005 | Alva | G06F 11/1064 711/104 |
| 2010/0064206 | A1* | 3/2010 | Moyer | G06F 11/1064 714/800 |
| 2011/0022801 | A1* | 1/2011 | Flynn | G06F 9/52 711/120 |
| 2011/0093654 | A1* | 4/2011 | Roberts | G06F 1/3203 711/105 |
| 2015/0127972 | A1 | 5/2015 | Chun et al. | |
| 2017/0103022 | A1* | 4/2017 | Kreinin | G06F 12/0842 |

(Continued)

OTHER PUBLICATIONS

Notice of Allowance dated Aug. 13, 2018 for U.S. Appl. No. 15/613,922, 16 pages.

*Primary Examiner* — Than Nguyen
(74) *Attorney, Agent, or Firm* — Wegman Hessler

(57) ABSTRACT

Cache memory for resistive switching memory modules is provided herein. The cache memory can reside on a separate DIMM from the resistive switching memory, in some embodiments, or can share a common DIMM with the resistive switching memory. Cache management protocols are provided to service read and write policies for managing interaction of data between the cache memory and the resistive switching memory. In various embodiments, memory controllers are optimized for physical characteristics of resistive switching memory, and cache management protocols can be implemented to take advantage of these characteristics.

20 Claims, 17 Drawing Sheets

(56) References Cited

U.S. PATENT DOCUMENTS

2017/0206131 A1 7/2017 Christensen
2017/0220480 A1* 8/2017 Chen .................. G06F 12/0846

* cited by examiner

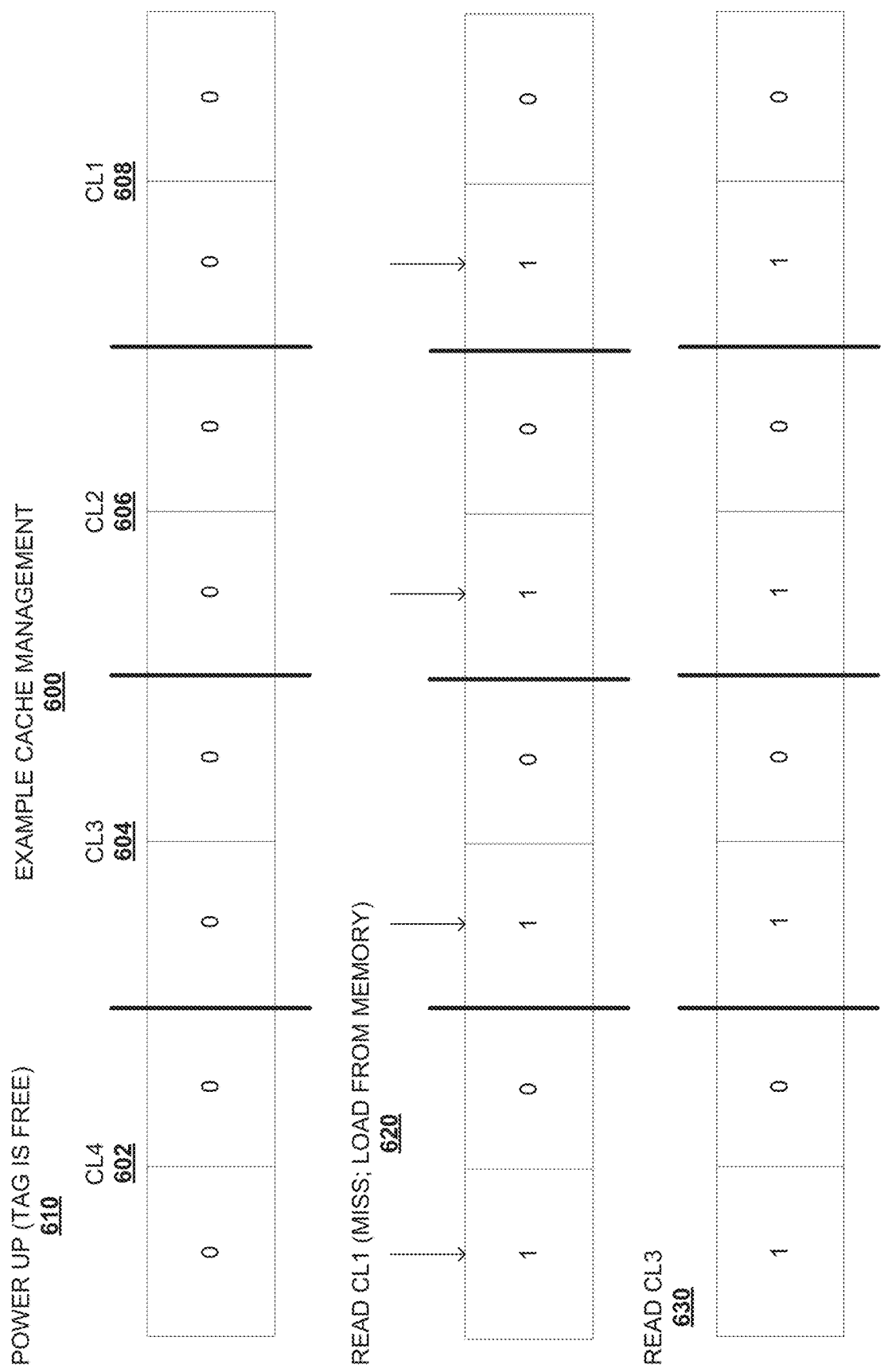

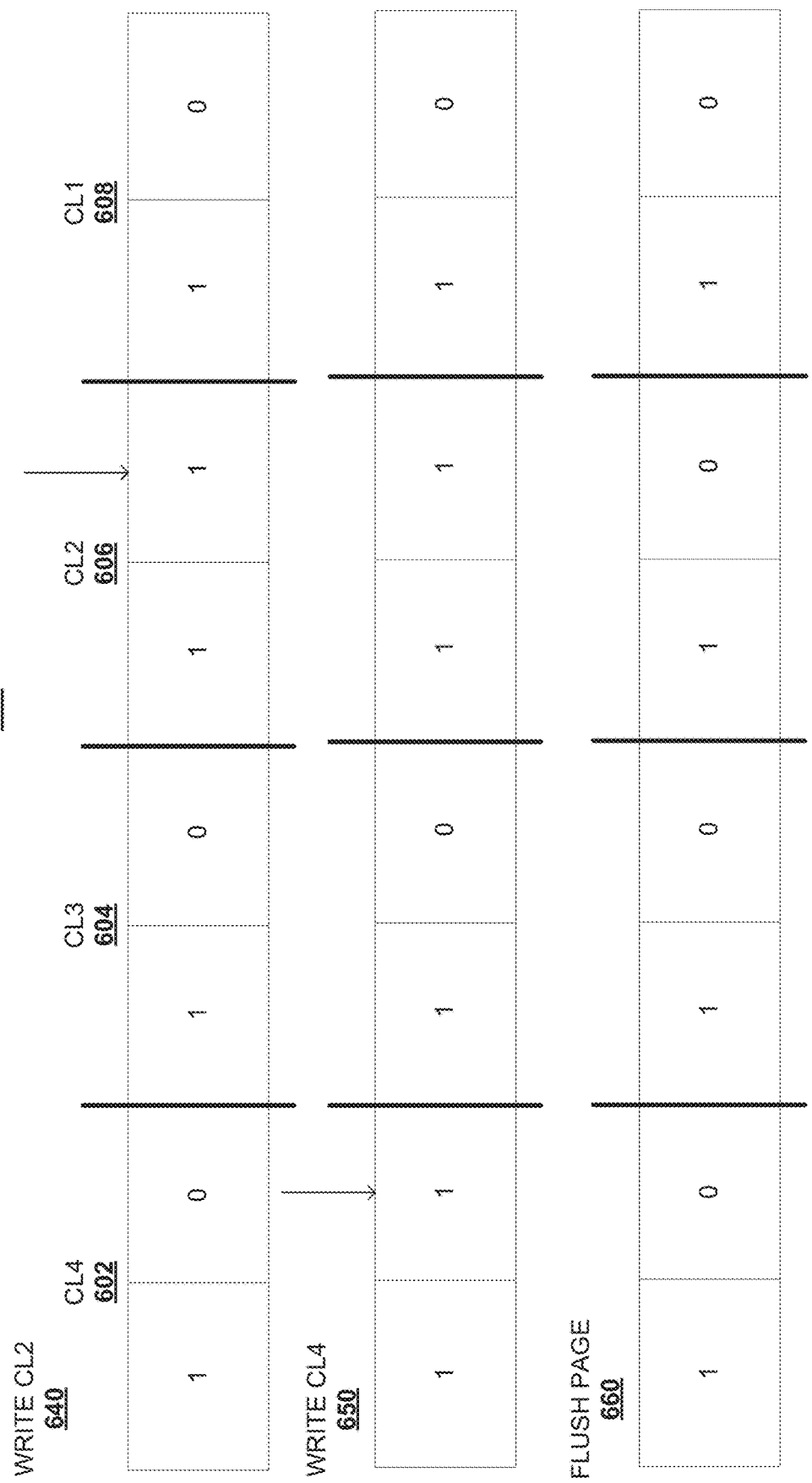

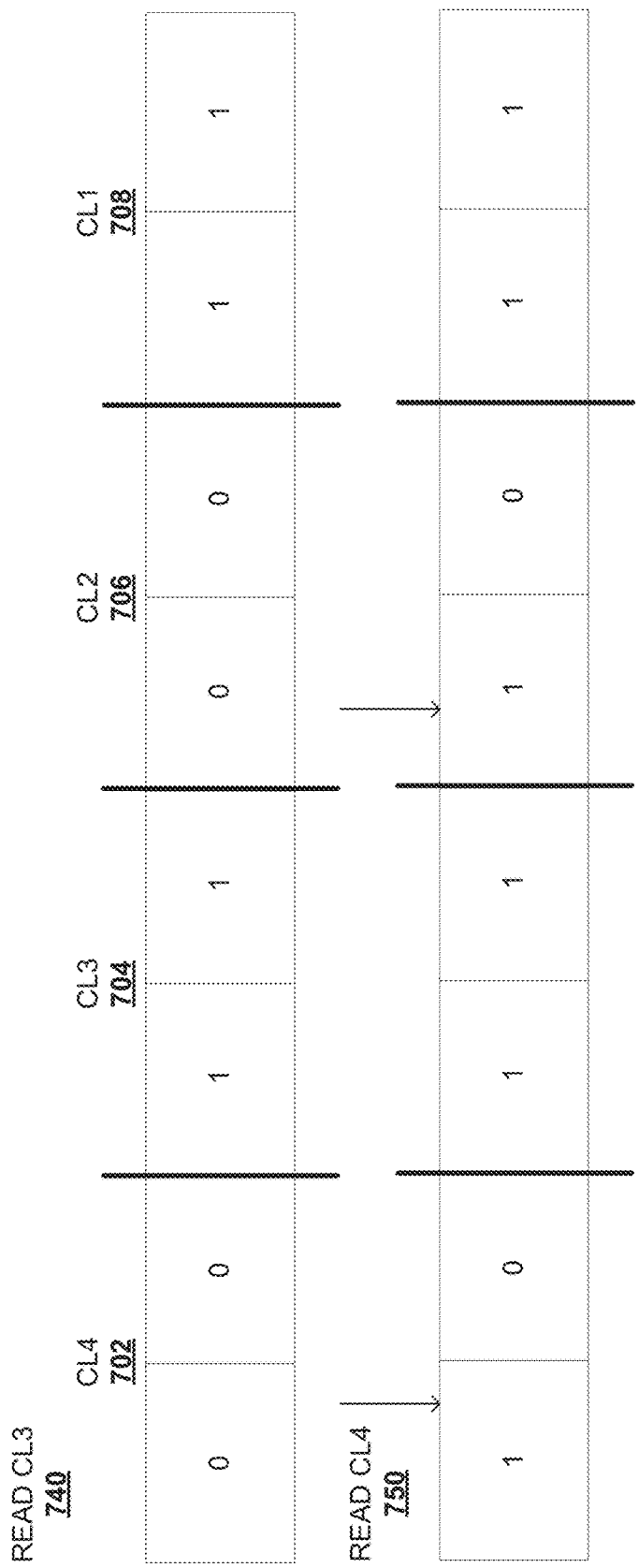

CACHE MANAGEMENT FOR MEMORY MODULE COMPRISING TWO-TERMINAL RESISTIVE MEMORY

CROSS-REFERENCE TO RELATED APPLICATIONS

The present application for patent claims the benefit of U.S. Provisional Patent Application No. 62/346,153 filed Jun. 6, 2016 and titled "PERSISTENT MEMORY ARCHITECTURE AND METHOD TO REDUCE WRITE STATUS POLLING TO ERRORS", which is hereby incorporated by reference herein in its entirety and for all purposes.

TECHNICAL FIELD

This disclosure relates generally to resistive switching memory architectures and providing read or write cache for non-volatile resistive switching memory.

BACKGROUND

The present invention is generally related to improving the architecture of cache and memory devices in order to reduce the average time to access data from the main memory (RRAM) as well as overcome various challenges associated with data storage and movement between CPU registers and RRAM memory devices. One such challenge includes addressing cache management issues, such as reconciling the transfer and access of bits when CPU cache accesses bits of a size that are different from RRAM memory page size.

Another disclosed invention relates to techniques to overcome limitations associated with status polling on an RRAM device (e.g., standalone memory). Polling is the process of periodically reading the status of an operational activity until a device indicates the operation is complete. For instance, a non-volatile flash memory requires status polling to determine whether a read or write command has completed, regardless of whether an error occurs or does not occur. As next generation non volatile memory technologies become faster and faster as compared to flash memories, current polling mechanisms are becoming antiquated and tend to consume a substantial amount of bus bandwidth which results in a lowering of system performance. As such, new methods for determining whether errors occur upon completion of a device operation are needed.

SUMMARY

The following presents a simplified summary of the specification in order to provide a basic understanding of some aspects of the specification. This summary is not an extensive overview of the specification. It is intended to neither identify key or critical elements of the specification nor delineate the scope of any particular embodiments of the specification, or any scope of the claims. Its purpose is to present some concepts of the specification in a simplified form as a prelude to the more detailed description that is presented in this disclosure.

This disclosure comprises embodiments of RRAM persistent memory architectures capable of mapping and managing cache lines between a RRAM memory device and a cache memory device at a page level granularity. Also disclosed is a method to reduce write status polling to errors. The method comprises employing an RRAM controller, MRAM controller, NRAM controller, or other non-volatile memory technoloy controller to act only upon a detected occurrence of an error rather than polling for a posted status during the time a command is executing.

The following description and the drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

Numerous aspects, embodiments, objects and advantages of the present invention will be apparent upon consideration of the following detailed description, taken in conjunction with the accompanying drawings, in which like reference characters refer to like parts throughout. In this specification, numerous specific details are set forth in order to provide a thorough understanding of this disclosure. It should be understood, however, that certain aspects of the subject disclosure may be practiced without these specific details, or with other methods, components, materials, etc. In other instances, well-known structures and devices are shown in block diagram form to facilitate describing the subject disclosure.

FIGS. 6 and 6A illustrate sample memory operations and corresponding cache management consistent with various disclosed embodiments.

FIGS. 7 and 7A depict additional example memory operations and corresponding cache management consistent with disclosed embodiments.

DETAILED DESCRIPTION

Figure 1:
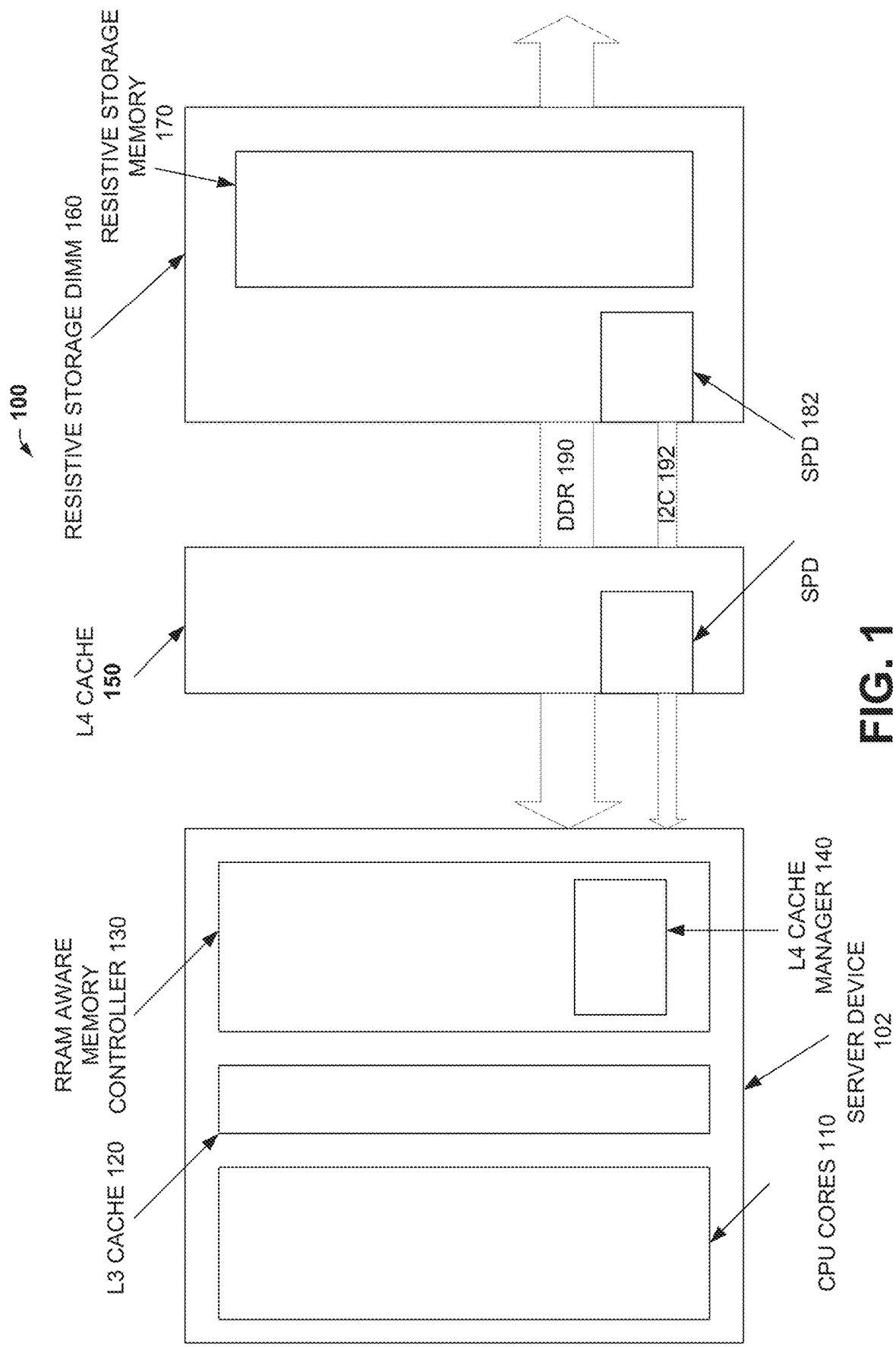
FIG. 1 illustrates a non-limiting example block diagram of a two terminal resistive persistive memory architecture.

The subject disclosure relates to a computing architecture that provides cache memory in conjunction with non-volatile resistive switching storage memory. In an aspect, the cache memory can be a suitable volatile memory, such as dynamic random access memory (DRAM), static random access memory (SRAM), magnetic random access memory (MRAM), or other high-speed memory that can be configured to operate on a high-speed data and control bus (e.g., a DRAM bus (e.g., DDR3, DDR4, etc.), a non-standard bus, or the like). The cache memory can share a dual-inline memory module (DIMM) with the resistive switching storage memory, in some embodiments, or can reside on a separate DIMM from the resistive switching storage memory, in further embodiments.

Further to the above, the subject disclosure provides a memory controller optimized for non-volatile resistive switching storage memory. In some embodiments, the memory controller can comprise a cache management module configured for operating the cache memory in conjunction with the storage memory. In such embodiments, the memory controller and cache management module can reside at a host device and communicate with the cache memory and storage memory over a data and control interface (e.g., DDR3 interface, DDR4 interface, or other suitable high-speed memory interface). In other embodiments, the cache management module can reside on a DIMM with the cache memory (and with the storage memory, in one or more embodiments), and cache operations can be opaque to the memory controller.

In one or more additional embodiments, cache management includes maintaining a tag table to map a block of cache memory to one or more physical pages of storage memory, and maintaining a flag table that maps one or more cache lines of the block of cache memory to a single physical page of the storage memory. In one embodiment(s), the flag table comprises a two-bit indicator for each cache line, including a valid bit to indicate whether data stored in an associated cache line matches a corresponding portion of the single physical page, and a write bit (also referred to herein as a dirty bit) to indicate whether the data stored in the associated cache line is more current than the data at the corresponding portion of the single physical page.

In another embodiment, cache management includes a conditional auto-validate process that reads data from the single physical page prior to flushing (e.g., writing) all data from the one or more cache lines to the single physical page of storage memory. In this embodiment, the flag table maintains only a dirty bit (write bit) for each of the cache lines associated with the single physical page of storage memory (and no valid bits). The conditional auto-validate performs the read operation if all dirty bits associated with the one or more cache lines are not set (a set dirty bit indicating 'dirty' data that is more current in the cache line than in the physical page of storage, and an unset dirty bit indicating that data in the cache line is not more current than the physical page of storage), and updates cache lines that are not dirty with data from the physical page of memory. This ensures that all data in cache is valid before writing from cache to storage. Once the conditional auto-validate is performed, all cached data can be written from the cache lines back to the physical page of memory without losing current data.

In yet another embodiment, cache management includes an auto-validate process in conjunction with each write miss to cache. When a write command comprising new data for the single physical page is received, the cache management will first update the one or more cache lines associated with the physical page with data currently stored at the physical page, and then overwrite a subset of the one or more cache lines with the new data. This ensures that all data in the cache lines is valid and dirty in response to the write command. In this latter embodiment, a flag table need only keep a single dirty bit (and no valid bits) for all cache lines associated with each physical page of storage memory.

Referring more generally to the disclosed embodiments, two-terminal memory cells can include a resistive technology, such as a resistive-switching two-terminal memory cell. Resistive-switching two-terminal memory cells (also referred to as resistive-switching memory cells or resistive-switching memory), as utilized herein, comprise circuit components having a pair of conductive contacts with an active region between the conductive contacts. The active region of the two-terminal memory device, in the context of resistive-switching memory, exhibits a plurality of stable or semi-stable resistive states, each resistive state having a distinct electrical resistance. Moreover, respective ones of the plurality of states can be formed or activated in response to a suitable electrical signal applied at the conductive contacts. These electrical signals can be selected to have suitable characteristics, such as a voltage or current value, a voltage or current polarity, a field strength, a field polarity, or the like, or a suitable combination thereof. Examples of a resistive switching two-terminal memory device, though not exhaustive, can include a resistive random access memory (RRAM), a phase change RAM (PCRAM) and a magnetic RAM (MRAM).

Programmable arrays described in the subject disclosure can be filamentary-based devices, in various embodiments, including, e.g., a non-volatile memory device, a volatile selector device, a combination of the foregoing, or a similar device. Composition of filamentary-based devices can vary per device, with different components selected to achieve desired characteristics (e.g., volatility/non-volatility, on/off current ratio, switching time, read time, memory durability, program/erase cycle, and so on). One example of a filamentary-based device can comprise: a conductive layer, e.g., metal, metal-alloy, metal-nitride, (e.g., comprising TiN, TaN, TiW, or other suitable metal compounds), an optional interface layer (e.g., doped p-type (or n-type) silicon (Si) bearing layer (e.g., a p-type or n-type Si bearing layer, p-type or n-type polysilicon, p-type or n-type polycrystalline SiGe, etc.)), a resistive switching layer (RSL) and an active metal-containing layer capable of being ionized. Under suitable conditions, the active metal-containing layer can provide filament-forming ions to the RSL. In such embodiments, a conductive filament (e.g., formed by the ions) can facilitate electrical conductivity through at least a subset of the RSL, and a resistance of the filament-based device can be determined, as one example, by a tunneling resistance between the filament and the conductive layer.

A RSL (which can also be referred to in the art as a resistive switching media (RSM)) can comprise, e.g., an undoped amorphous Si-containing layer, a semiconductor layer having intrinsic characteristics, a silicon nitride (e.g., SiN, Si3N4, SiNx, etc.), a Si sub-oxide (e.g., SiOx wherein x has a value between 0.1 and 2), a Si sub-nitride, a metal oxide, a metal nitride, a non-stoichiometric silicon compound, and so forth. Other examples of materials suitable for the RSL could include SixGeyOz (where x, y and z are respective suitable positive numbers), a silicon oxide (e.g., SiON, where N is a suitable positive number), a silicon oxynitride, an undoped amorphous Si (a-Si), amorphous SiGe (a-SiGe), TaOB (where B is a suitable positive number), HfOC (where C is a suitable positive number), TiOD (where D is a suitable number), Al2OE (where E is a suitable positive number) and so forth, a nitride (e.g. AN, SiN), or a suitable combination thereof.

In some embodiments, a RSL employed as part of a non-volatile memory device (non-volatile RSL) can include a relatively large number (e.g., compared to a volatile selector device) of material voids or defects to trap neutral metal particles (at least at low voltage) within the RSL. The large number of voids or defects can facilitate formation of a thick, stable structure of the neutral metal particles. In such a structure, these trapped particles can maintain the non-volatile memory device in a low resistance state in the absence of an external stimulus (e.g., electrical power), thereby achieving non-volatile operation. In other embodiments, a RSL employed for a volatile selector device (volatile RSL) can have very few material voids or defects. Because of the few particle-trapping voids/defects, a conductive filament formed in such an RSL can be quite thin, and unstable absent a suitably high external stimulus (e.g., an electric field, voltage, current, joule heating, or a suitable combination thereof). Moreover, the particles can be selected to have high surface energy, and good diffusivity within the RSL. This leads to a conductive filament that can form rapidly in response to a suitable stimulus, but also deform quite readily, e.g., in response to the external stimulus dropping below a deformation magnitude. Note that a volatile RSL and conductive filament for the selector device can have different electrical characteristics than a conductive filament and non-volatile RSL for the non-volatile memory device. For instance, the selector device RSL can have higher material electrical resistance, and can have higher on/off current ratio, among others.

An active metal-containing layer for a filamentary-based memory cell can include, among others: silver (Ag), gold (Au), titanium (Ti), titanium-nitride (TiN) or other suitable compounds of titanium, nickel (Ni), copper (Cu), aluminum (Al), chromium (Cr), tantalum (Ta), iron (Fe), manganese (Mn), tungsten (W), vanadium (V), cobalt (Co), platinum (Pt), hafnium (Hf), and palladium (Pd). Other suitable conductive materials, as well as compounds, nitrides, oxides, alloys, or combinations of the foregoing or similar materials can be employed for the active metal-containing layer in some aspects of the subject disclosure. Further, a non-stoichiometric compound, such as a non-stoichiometric metal oxide or metal nitride (e.g., AlOx, AlNx, CuOx, CuNx, AgOx, AgNx, and so forth, where x is a suitable positive number 0<x<2, which can have differing values for differing ones of the non-stoichiometric compounds) or other suitable metal compound can be employed for the active metal-containing layer, in at least one embodiment.

In one or more embodiments, a disclosed filamentary resistive switching device can include an active metal layer comprising a metal nitride selected from the group consisting of: TiNx, TaNx, AlNx, CuNx, WNx and AgNx, where x is a positive number. In a further embodiment(s), the active metal layer can comprise a metal oxide selected from the group consisting of: TiOx, TaOx, AlOx, CuOx, WOx and AgOx. In yet another embodiment(s), the active metal layer can comprise a metal oxi-nitride selected from the group consisting of: TiOaNb, AlOaNb, CuOaNb, WOaNb and AgOaNb, where a and b are positive numbers. The disclosed filamentary resistive switching device can further comprise a switching layer comprising a switching material selected from the group consisting of: SiOy, AlNy, TiOy, TaOy, AlOy, CuOy, TiNx, TiNy, TaNx, TaNy, SiOx, SiNy, AlNx, CuNx, CuNy, AgNx, AgNy, TiOx, TaOx, AlOx, CuOx, AgOx, and AgOy, where x and y are positive numbers, and y is larger than x. Various combinations of the above are envisioned and contemplated within the scope of embodiments of the present invention.

In one example, a disclosed filamentary resistive switching device comprises a particle donor layer (e.g., the active metal-containing layer) comprising a metal compound and a resistive switching layer. In one alternative embodiment of this example, the particle donor layer comprises a metal nitride: MNx, e.g., AgNx, TiNx, AlNx, etc., and the resistive switching layer comprises a metal nitride: MNy, e.g., AgOy, TiOy, AlOy, and so forth, where y and x are positive numbers, and in some cases y is larger than x. In an alternative embodiment of this example, the particle donor layer comprises a metal oxide: MOx, e.g., AgOx, TiOx, AlOx, and so on, and the resistive switching layer comprises a metal oxide: MOy, e.g., AgOy, TiOy, AlOy, or the like, where y and x are positive numbers, and in some cases y is larger than x. In yet another alternative, the metal compound of the particle donor layer is a MNx (e.g., AgNx, TiNx, AlNx, etc.), and the resistive switching layer is selected from a group consisting of MOy (e.g., AgOy, TiOy, AlOy, etc.) and SiOy, where x and y are typically non-stoichiometric values, or vice versa in a still further embodiment.

As utilized herein, variables x, a, b, and so forth representative of values or ratios of one element with respect to another (or others) in a compound can have different values suitable for respective compounds, and are not intended to denote a same or similar value or ratio among the compounds. Some details pertaining to embodiments of the subject disclosure similar to the foregoing example(s) can be found in the following U.S. patent applications that are licensed to the assignee of the present application for patent application Ser. No. 11/875,541 filed Oct. 19, 2007 and application Ser. No. 12/575,921 filed Oct. 8, 2009, and the following U.S. patent application assigned to the assignee of the present application for patent application Ser. No. 14/588,185 filed Dec. 31, 2014; each of the foregoing patent applications are hereby incorporated by reference herein in their respective entireties and for all purposes.

It should be appreciated that various embodiments herein may utilize a variety of memory cell technologies, having different physical properties. For instance, different resistive-switching memory cell technologies can have different discrete programmable resistances, different associated program/erase voltages, as well as other differentiating characteristics. For instance, various embodiments of the subject disclosure can employ a bipolar switching device that exhibits a first switching response (e.g., programming to one of a set of program states) to an electrical signal of a first polarity and a second switching response (e.g., erasing to an erase state) to the electrical signal having a second polarity. The bipolar switching device is contrasted, for instance, with a unipolar device that exhibits both the first switching response (e.g., programming) and the second switching response (e.g., erasing) in response to electrical signals having the same polarity and different magnitudes.

In various embodiments, filamentary-based resistance switching devices can operate in a bipolar fashion, behaving differently in response to different polarity (or direction, energy flow, energy source orientation, etc.) external stimuli. For the volatile filamentary-based selector device, as an illustrative example, in response to a first polarity stimulus exceeding a first threshold voltage (or set of voltages), the filamentary selector device can change to a second resistance state from a first resistance state. Moreover, in response to a second polarity stimulus exceeding a second threshold voltage(s), the filamentary selector device can change to a third state from the first state. In some embodiments, the third state can be substantially the same as the first state, having the same or similar measurably distinct characteristic (e.g., electrical conductivity, and so forth), having the same or similar magnitude of threshold stimulus (though of opposite polarity or direction), or the like. In other embodiments, the third state can be distinct from the second state, either in terms of the measurable characteristic (e.g., different electrically conductivity value in response to the reverse polarity as compared to the forward polarity) or in terms of threshold stimulus associated with transitioning out of the first state (e.g., a different magnitude of positive voltage required to transition to the second state, compared to a magnitude of negative voltage required to transition to the third state).

For bipolar operation of a non-volatile filamentary-based memory cell, a conductive path or a filament forms through a non-volatile RSL in response to a suitable program voltage applied across the memory cell. In particular, upon application of a programming voltage, metallic ions are generated from the active metal-containing layer and migrate into the non-volatile RSL layer. The metallic ions can occupy voids or defect sites within the non-volatile RSL layer. In some embodiments, upon removal of the bias voltage, the metallic ions become neutral metal particles and remain trapped in voids or defects of the non-volatile RSL layer. When sufficient particles become trapped, a filament is formed and the memory cell switches from a relatively high resistive state, to a relatively low resistive state. More specifically, the trapped metal particles provide the conductive path or filament through the non-volatile RSL layer, and the resistance is typically determined by a tunneling resistance through the non-volatile RSL layer. In some resistive-switching devices, an erase process can be implemented to deform the conductive filament, at least in part, causing the memory cell to return to the high resistive state from the low resistive state. More specifically, upon application of an erase bias voltage, the metallic particles trapped in voids or defects of the non-volatile RSL become mobile ions and migrate back towards the active metal layer. This change of state, in the context of memory, can be associated with respective states of a binary bit. For an array of multiple memory cells, a word(s), byte(s), page(s), block(s), etc., of memory cells can be programmed or erased to represent zeroes or ones of binary information, and by retaining those states over time in effect storing the binary information. In various embodiments, multi-level information (e.g., multiple bits) may be stored in such memory cells.

Where no specific memory cell technology or program/erase voltage is specified for the various aspects and embodiments herein, it is intended that such aspects and embodiments incorporate any suitable memory cell technology and be operated by program/erase voltages appropriate to that technology, as would be known by one of ordinary skill in the art or made known to one of ordinary skill by way of the context provided herein. It should be appreciated further that where substituting a different memory cell technology would require circuit modifications that would be known to one of ordinary skill in the art, or changes to operating signal levels that would be known to one of such skill, embodiments comprising the substituted memory cell technology(ies) or signal level changes are considered within the scope of the subject disclosure.

Referring now to the drawings, FIG. 1 illustrates a block diagram of an example non-limiting three-dimensional resistive switching memory persistent memory architecture 100. In an aspect, FIG. 1 illustrates resistive switching memory persistent memory architecture 100 which includes multi-core CPU 110, L3 cache 120, resistive switching memory aware memory controller 130, L4 cache manager 140, L4 cache 150, and resistive switching memory DIMM 160. In an aspect, commands received over a host interface can be temporarily held in a buffer for processing by multi-core CPU 110, according to protocols or instructions maintained in ROM or RAM. Also, the data transferred over a host interface can also be held temporarily in buffer, whether for output to a host device or for writing to hard drive media. In another aspect, illustrated is L3 cache 120 that is configured to be a third level cache located on the multi-core CPU 110 of a computing device. Also illustrated is a resistive switching memory aware memory controller 130 that can be configured to be optimized for timing, parameters and characteristics of resistive switching memory of resistive switching memory DIMM 160. Further, resistive switching memory aware memory controller 130 can be configured to operate in conjunction with a L4 cache 150 and resistive switching memory DIMM 160. In an aspect, the capacity of the cache 150 is typically on the order of 10's of Giga Bytes (GB) and capable of being accessed by a standard memory controller, such as a DRAM memory controller (where L4 cache 150 is a DRAM memory) over a standard memory bus. On the other hand, capacity of the resistive switching memory DIMM 160 is on the order of 100's or 1000's of GB and hence substantially (by orders of magnitude) larger than the cache 150.

In one aspect, illustrated is an L4 cache manager 140 configured to retrieve data from the L4 cache 150. The multi-core CPU 110, L3 cache 120, resistive switching memory aware memory controller 130, and L4 cache manager 140 are all capable of operating within a device (e.g., a server device 102). The L4 cache 140 is located on and configured to communicate via a suitable communication bus such as first double data rate (DDR3, DDR4, DDR5) compliant dual inline memory module (DIMM) and the resistive switching memory DIMM 160 is located on a first or a second DDR bus. In another aspect, the non-limiting example embodiment of a resistive switching memory persistent memory architecture 100 can further comprise an L4 cache 150 that can include any of a number of memory types such as a dynamic random-access memory (DRAM), a static random-access memory (SRAM), a magnetoresistive random-access memory (MRAM) or other such memory types that are capable of operating directly on a double data rate (DDR) bus 190 (e.g., DDR bus 190 can be any of a variety of DDR's including DDR3, DDR4, or DDR5) or low-power double data rate interface (e.g., LPDDR3, LPDDR4) and support a standard DDR protocol absent of any driver, software support, or special hardware requirements. Yet in another aspect, the resistive switching memory DIMM 160 is electrically compliant with the DDR standard but does not directly support the DDR protocol. Hence, a resistive switching memory aware memory controller 130 can be configured to support such devices communicatively connected to the DDR bus 190 absent of any driver, or software support. For instance, resistive switching memory aware memory controller 130 is capable of being configured and/or programmed to communicate with the resistive switching memory DIMM 160 using the DDR protocol such that the speed, grades, timing and size of data transfer and access can be achieved between server 102, L4 cache 150 and resistive switching memory DIMM 160.

Furthermore, in an aspect, a resistive switching two terminal memory device (such as a resistive switching memory 170) can be a stand-alone device configured to communicate with a remote host device (e.g., server 102) via a suitable remote communication platform (e.g. resistive switching memory DIMM 160). The resistive switching memory 170 can be located on the resistive switching memory DIMM 160 module which is communicatively coupled to a DDR bus 190 such that communication between the server 102, L4 cache 150, and resistive switching memory DIMM 160 occurs over the bus using a DDR protocol supported by the DDR bus 190. Also the L4 cache 150 and the resistive switching memory 170 are capable of storing serial presence detect (SPD) data using an SPD device 182 located on the L4 cache 150 and resistive switching memory DIMM 160 respectively. In an aspect, the SPD data can be read by the CPU (e.g., using software such as BIOS) to help standardize the configuration, timing, capacity, and manufacturing of information on the L4 cache 150 and the resistive switching memory 170. Furthermore, a I2C bus 192 interface may be employed to facilitate control communication between L4 cache 140, resistive switching memory 170, and server device 102.

In an aspect, the resistive switching memory persistent memory architecture 100 facilitates the L4 cache 150 to be managed at a CPU cache line granularity. That is, the CPU can request a subset of bytes (a cache line) from a larger set of bytes stored at the L4 cache 150 (e.g., after misses occur at L1, L2, and L3 caches). The L4 cache 150 can determine the presence of such bytes as requested by the CPU and if the requested data is present in the L4 cache 150 (e.g., in the table), then a hit occurs and the bytes are sent to the CPU. If a miss occurs (e.g., absence of the bytes within L4 cache 150) then the data is fetched from the resistive switching memory 170. The data once found within resistive switching memory 170 is written to the L4 cache 150 and furthermore, data within the L4 cache 150 can be evicted to make space for the upcoming bytes written from resistive switching memory 170 to L4 cache 150, if space for the upcoming bytes is needed. The subset of bytes can then be transferred between resistive switching memory 170 and L4 cache 150.

In an aspect, resistive switching memory 170 can be organized into a plurality of blocks of physical memory, respectively having a plurality of physical pages of memory, and L4 cache 150 comprises one or more cache lines that act as apertures or windows into the physical pages within the resistive switching memory 170. Also cache entries in the L4 cache 150 can be managed at a granularity of one or more physical pages, a single physical page, or a portion of a physical page (e.g., a portion equivalent to one or more cache lines of L4 cache 150). Thus, for instance, a cache block within the L4 cache 150 can provide a window into one or more physical pages within the resistive switching memory 170. Furthermore, one or more cache lines of the cache block can provide a window into a single physical page within resistive switching memory 170.

Accordingly, the cache block within L4 cache 150 can correspond to one or more pages of resistive switching memory 170 via apertures that act as windows into the resistive switching memory 170. The aperture can comprise a predetermined range of addresses within an accessible range of memory (e.g., resistive switching memory DIMM 170). The resistive switching memory aware memory controller 130 can function to map an address of a data block in a persistent storage medium into an accessible memory address range of at least one processor of the multi-core CPU 110. For instance, memory controller 130 can check for a hit by looking in L4 cache 130 for the address entry sent by the processor. If a hit occurs, then for a read operation, the memory controller 130 reads the contents of the cache data store at the same line address within L4 cache 130 and sends them to the processor. Thus, in addition to mapping an address of a data block, the resistive switching memory aware memory controller 130 can also manage the L4 cache by facilitating the transfer of data.

In an instance, resistive switching memory aware memory controller 130 can use the L4 cache manager 140 during a read operation and reads the information from the resistive switching memory 170 and transfer the information to the L4 cache 150. The resistive switching memory aware memory controller 140 can also seek out information within L4 cache 150 to determine whether a hit or a miss of information sought within the L4 cache 150 occurs. Upon a miss, the L4 cache 150 retrieves the information from resistive switching memory DIMM 170 and writes it back to the L4 cache 150 memory.

Figure 2:
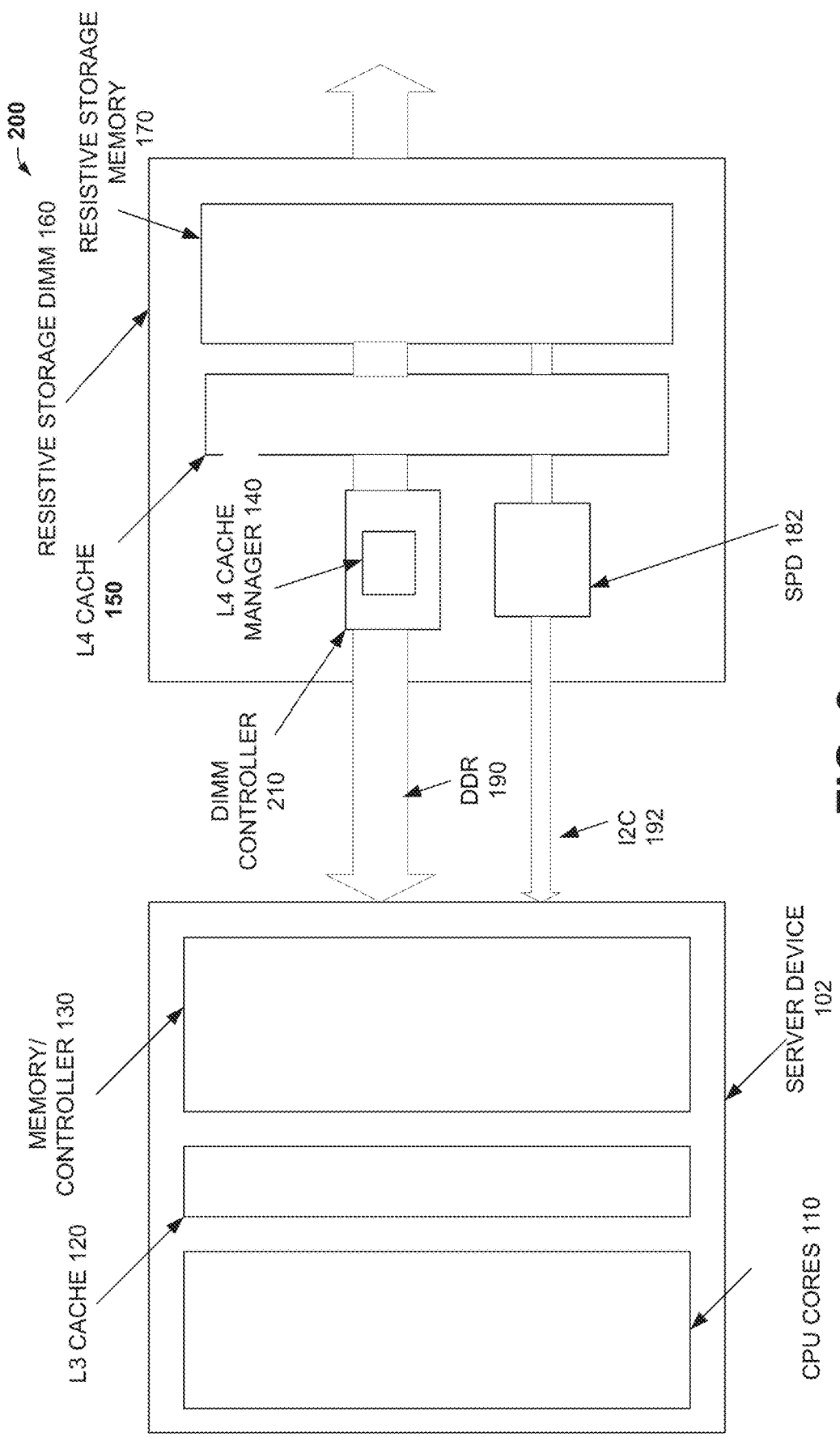
FIG. 2 illustrates a non-limiting example block diagram of a two terminal resistive integrated persistive memory architecture.

Turning now to FIG. 2, illustrated is another non-limiting embodiment of resistive switching memory persistent memory architecture 200. In an aspect, resistive switching memory persistent memory architecture 200 comprises multi-core CPU 110, L3 cache 120, memory controller 130, L4 cache manager 140, L4 cache 150, and resistive switching memory 170. Furthermore, in an aspect, the L4 cache 150 is located on the resistive switching memory DIMM 160 module as well as DIMM controller 210. Furthermore, the L4 cache 150 (e.g., DRAM) is now located within the resistive switching memory DIMM 160 module as well, therefore both the cache memories and the cache controllers are integrated within the resistive switching memory DIMM 160 module. Furthermore, SPD device 182 can be located on the resistive switching memory 170 and communicatively coupled with the I2C interface 192.

In this embodiment, the cache can be any of a variety of cache's configured to communicate on a DDR bus 190. For instance, the cache can be a DRAM, SRAM, embedded DRAM (EDRAM), MRAM, or other such types of memory. Furthermore, the DDR bus 190 and corresponding cache communicatively coupled to the DDR bus 190 can support the DDR protocol absent any driver, software support, or special hardware, in some embodiments. The disclosed persistent memory architecture 200 can overcome challenges including flushing the cache into the resistive switching memory 170 during unintentional power downs, and propagating CPU flush instructions to the resistive switching memory DIMM 160 module. A buffer (not depicted) that is on board the memory controller 130 can help facilitate better performance advantages of the architectural components. In another aspect, resistive switching memory persistent memory architecture 200 allows for a flush command to be controlled by the L4 cache manager 140. However, the L4 cache manager 140 can be located within DIMM controller 210, whereas in persistent memory architecture 100 of FIG. 1, supra, the flush command is received by L4 cache manager 140 at the resistive switching memory aware memory controller 130 within server device 102, which is separate from the resistive storage DIMM 160.

Figure 3:
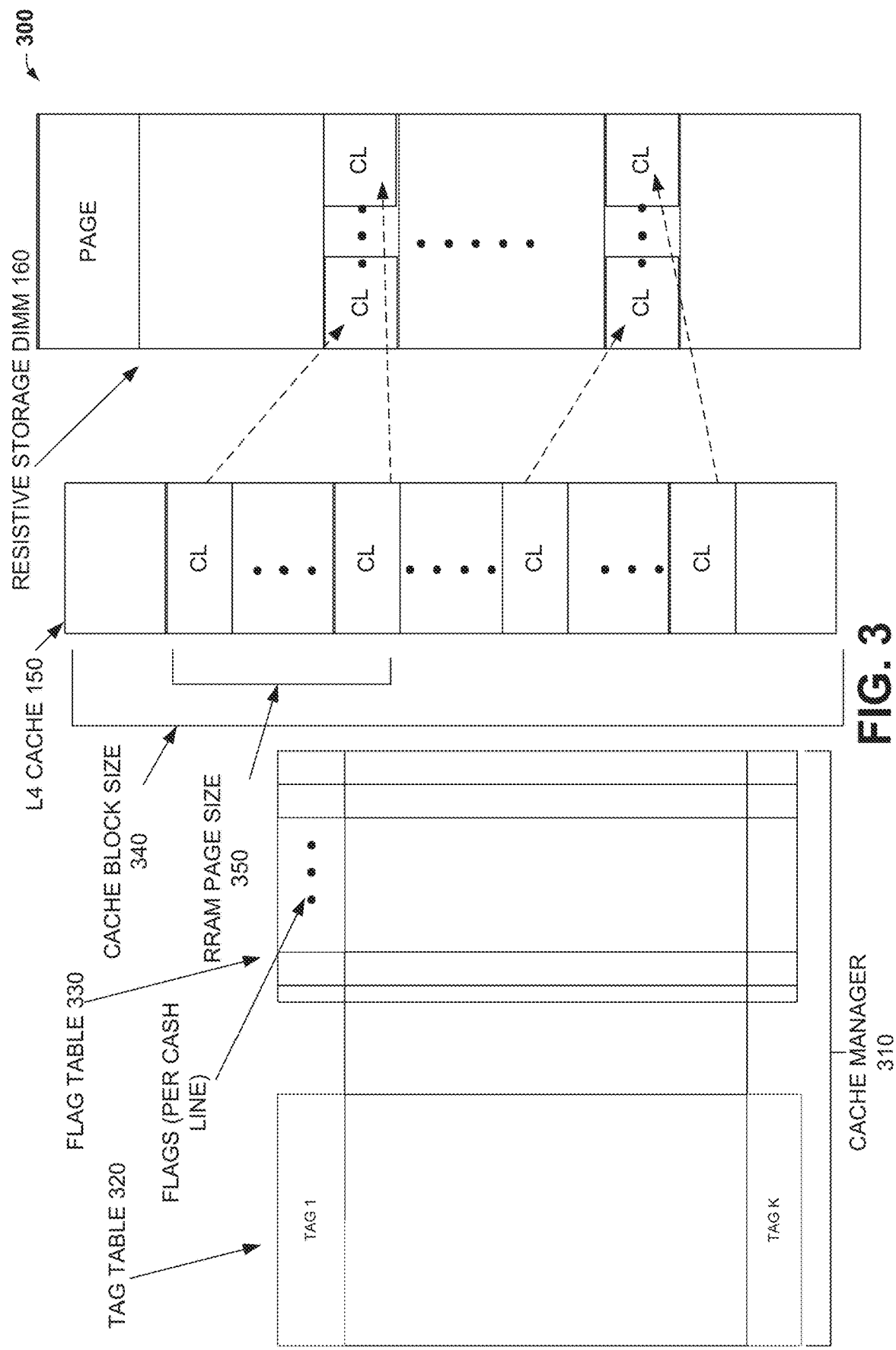
FIG. 3 illustrates a non-limiting example block diagram of a two terminal resistive memory cache architecture.

Turning now to FIG. 3, illustrated is a cache management architecture 300 in accordance with the disclosed persistent memory resistive switching memory architectures disclosed herein. In an aspect, architecture 300 comprises L4 cache 150 that comprises data capable of transfer between the L4 cache 150 and the resistive switching memory device 170. Data transferred between L4 cache 150 and resistive switching memory device 170 can be implemented in fixed size cache blocks as illustrated by cache block size 340. The cache block 340 provides a window into a corresponding one or more pages of resistive switching memory 170. Likewise, a plurality of cache lines provides a window into a corresponding single physical page of resistive switching memory 170 having a single physical page size 350. Thus each cache line corresponds to a portion of one physical page located within resistive switching memory 170.

Also disclosed is a one-way cache manager 310 comprising a tag table 320 and a flag table 330. In an aspect, the tag table can comprise K tag entries and the address index selects one of the entries from the tag table for hit determination. A hit determination occurs when the processor attempts to read or write a location within the main memory (e.g., resistive switching memory 170). The processor will first check for an entry with corresponding data in the cache (e.g., L4 cache 150). The cache checks for the content of the memory location in any of the cache lines possibly containing the sought after address. Upon finding the memory location in the cache, a cache hit occurs and the processor reads or writes the data in the cache line. However, upon the absence of the sought after address in the cache, a cache miss occurs and the cache allocates a new entry as well as copies data from the resistive switching memory 170 into the L4 cache 150.

In another aspect, architecture 300 allows for tags and flags to be associated with each cache line. Tags are represented by tag entries with a tag table 320. The tag entries can be indexed by address such that each address can be selected for determination as to whether it satisfies a request from the processor. Furthermore, in an aspect, each tag corresponds to one or more pages of resistive switching memory DIMM 160, with each such page corresponding to one or more cache lines, as described above. Flag table 330 can assign a bit indicator to each cache line of L4 cache 150 (or assigned to a plurality of cache lines, in some embodiments). The bit indicator can include a two-bit indicator, in some embodiments, in which a first bit indicates validity of data in a corresponding cache line, and a write bit (or dirty bit) indicates data in the cache line that is more recent than data in corresponding portion of a physical page of resistive switching memory 170. In another embodiment, the bit indicator can include merely the dirty bit for each cache line, or for a group of cache lines. In general, upon the occurrence of a hit on a tag, the hit signal is then validated by a flag within the flag table 220.

In various embodiments, each flag maintains a status of each cache line (or a group of cache lines, in some embodiments) associated with a tag. The status can be determined from one or more status bits associated with each cache line or each group of cache lines. For a two-bit status indicator, the first bit can indicate validity of a corresponding cache line (e.g., a zero meaning invalid and a one meaning valid data) and the second bit can be a write status bit (e.g., a zero indicating non-dirty data and a one indicating dirty data). In such embodiments, a first bit that is zero and a second bit that is zero indicates a status that the corresponding cache line does not contain valid data (e.g., does not match data in resistive switching memory 170, or has not been updated with write data), and does not contain newly written data (dirty data) from a host device that is awaiting transfer to resistive switching memory 170. A first bit that is a one corresponds to a cache line that has valid data. For instance, a first bit that is a one and a second bit that is a zero indicates that the cache line has valid data, but has not been updated by a host and awaiting transfer to resistive switching memory 170. When the dirty bit is zero, the cache line also does not have to be flushed during eviction. In another instance, a first bit that is a one and a second bit that is a one indicates that a cache line has valid data and has been updated with new data from the host, and this cache line has to be flushed during eviction.

In one or more embodiments, an auto-validate process or conditional auto-validate process can be implemented by cache manager 310. For the auto-validate process, flag table 330 comprises merely a single cache status bit per group of cache lines 350 corresponding to a physical page of resistive switching memory 170. As part of the auto-validate process, cache manager 310 implements a page read from the physical page of resistive switching memory 170 for each write miss to L4 cache 150, and transfers stored data from the physical page to the group of cache lines associated with the physical page. Then cache manager 310 overwrites one or more of the cache lines of the group of cache lines with the write data associated with the write miss. Thus, all data is valid due to the pre-read to cache before overwriting the write data to the cache, and valid bits are not required. Because all data is valid, cache manager 310 need maintain only a single dirty bit, because the data from cache need not be selectively written to the resistive switching memory 170. Rather, after overwriting the write data to the cache, all the data from the group of cache lines is ready to be written to resistive switching memory 170. Thus, cache manager 310 can maintain no valid bits and only a single dirty bit for a group of cache lines in conjunction with the auto-validate process. In at least some embodiments, resistive storage DIMM 160 can operate with an optimized write algorithm that facilitates sub-page write operations (e.g., byte-size write, or even bit-size write), and further will selectively update memory cells of the physical page that are changed by newly written data from cache, and not update memory cells that currently hold the same digital value as a corresponding bit of the newly written data from cache. In this embodiment, architecture 300 will not employ extra write overhead from having only a single dirty bit, as only bits of the new data stored in the group of cache lines that actually differ from bits currently stored in the resistive memory will be updated by the flush process.

In the conditional auto-validate process, cache manager 310 maintains no valid bits, but one dirty bit for each cache line of the group of cache lines. This embodiments utilizes a one bit status indicator for the group of cache lines. A write miss can be implemented similar for the two bit status indicator described above, writing new data to a cache line(s) upon determining that the new data is not already cached. When a flush operation is implemented, cache manager 310 will identify whether all of the dirty bits for the group of cache lines are set, or fewer than all the dirty bits are set. If all the dirty bits are set, a read from resistive switching memory 170 is not needed, and the group of cache lines can simply be written to the resistive storage DIMM 160 (optionally utilized the optimized write algorithm for selective updating of memory cells, described above). If fewer than all dirty bits are set, cache manager 310 will implement a read from the physical page associated with the group of cache lines, and selectively update those cache lines whose dirty bits are unset. After the read and selective updating, the group of cache lines can be flushed and written to the single physical page (again, optionally according to the optimized write algorithm for selective updating of memory cells). Thus, in various embodiments, flag table 330 can comprise two-bit status indicators for each cache line, a one-bit status indicator for each cache line, or a single status bit for each group of cache lines corresponding with a physical page of resistive switching memory 170.

Figure 4:
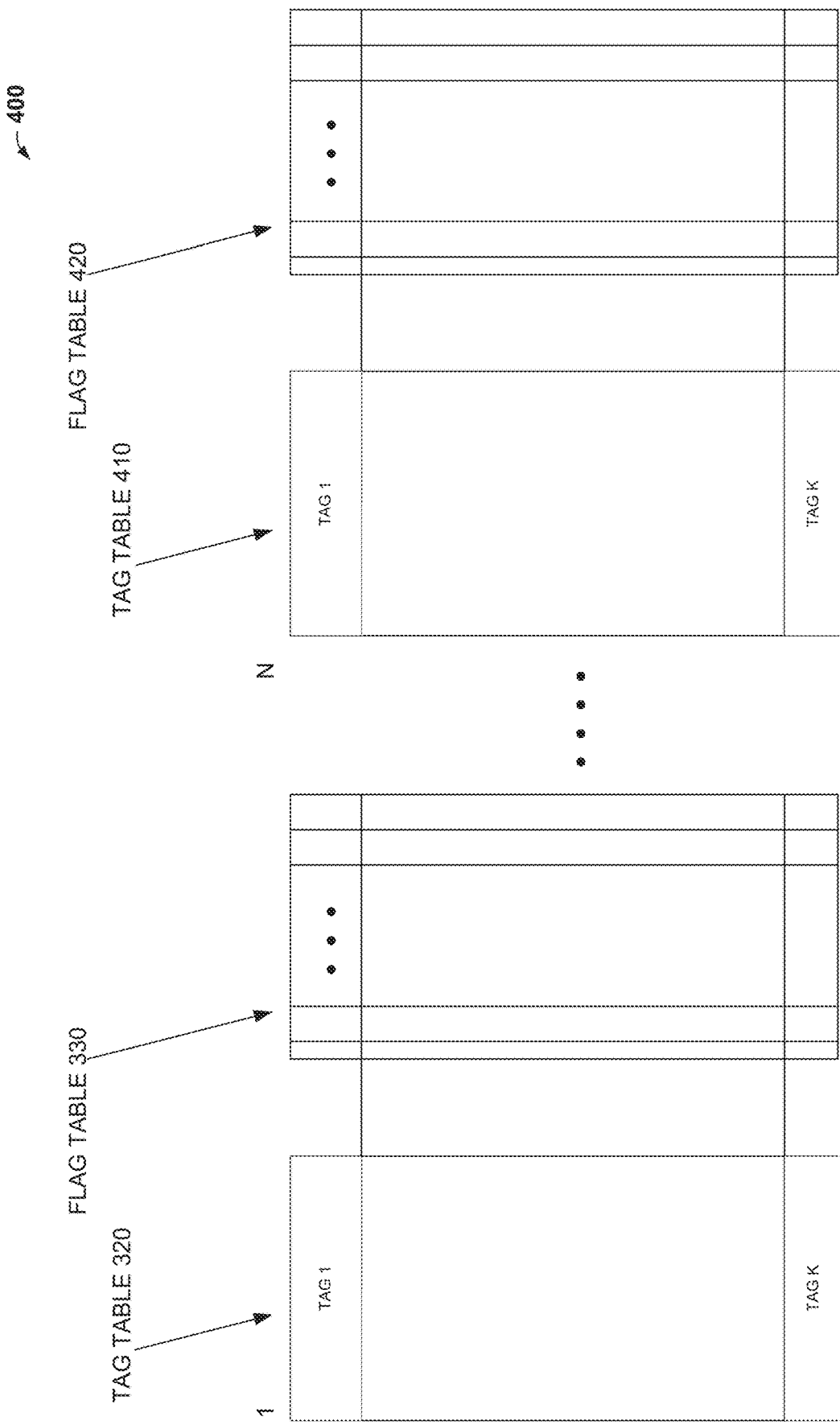
FIG. 4 illustrates a non-limiting example block diagram of a two terminal resistive memory cache architecture.

Turning now to FIG. 4, illustrated is a three dimensional resistive switching memory cache architecture 400. In an aspect, illustrated are a set of flag tables and tag tables that can be maintained by a cache manager (e.g., see cache manager 310 of FIG. 3, supra). As illustrated, the set of tag tables can include tag table$_1$ 320, flag table$_1$ 330, up through tag table$_N$ 410, and flag table$_N$ 420, where N is a suitable integer greater than one. In an aspect, each flag table has K tag entries, where K represents an integer greater than zero. In conjunction with a read or write process to an associated storage memory (e.g., resistive storage DIMM 160) all K sets of tags are compared for hit determination to satisfy a processor request. Each set of tags comprises K tag entries where each tag corresponds to one or more physical pages stored at resistive switching memory 170. Furthermore, each physical page further corresponds to one or more cache lines. In an aspect, a hit signal on a tag entry has to further be validated by the flag entries corresponding to individual cache lines of the groups of cache lines associated with the tag entry.

As such, each cache search includes an address that comprises a tag and an index which are referenced sequentially within set of tag tables until a hit is determined, or until all tag tables of the set of tag tables have been searched. Thus, a cache search starts with tag table 320. Upon occurrence of an address hit, the address status is checked using flag table 330 to determine if a cache block has been loaded with valid data. If a dirty bit or invalid data is identified, then the cache line has been changed since it was read from main memory and therefore is dirty such that the search must continue. If no hit occurs, then the next tag table (up through tag table$_N$ 410) is searched by an address index to identify the matching address of the tag. This process continues until tag table$_N$ 410 is searched.

At the flag table$_1$ 320 through flag table$_N$ 420 there are one or more flags per physical page located within the resistive switching memory 170 (also referred to as a page of storage memory). Also, there are one or more flags per tag entry, where a tag entry can comprise multiple pages of storage memory. Furthermore, each cache line can be associated with a two bit status indicator or a one bit status indicator. In additional embodiments, a group of cache lines associated with a page of storage memory can have only a single dirty bit indicator. In response to a cache read miss, data from the page of storage memory is read into an associated group of cache lines, and the valid bits of all cache line flags can be set. In response to a cache write miss, write data is written to one or more cache lines of the group of cache lines (optionally after a forced read to the cache lines in the auto-validate process described herein) and a dirty bit(s) associated with the one or more cache lines are set.

Figure 5:
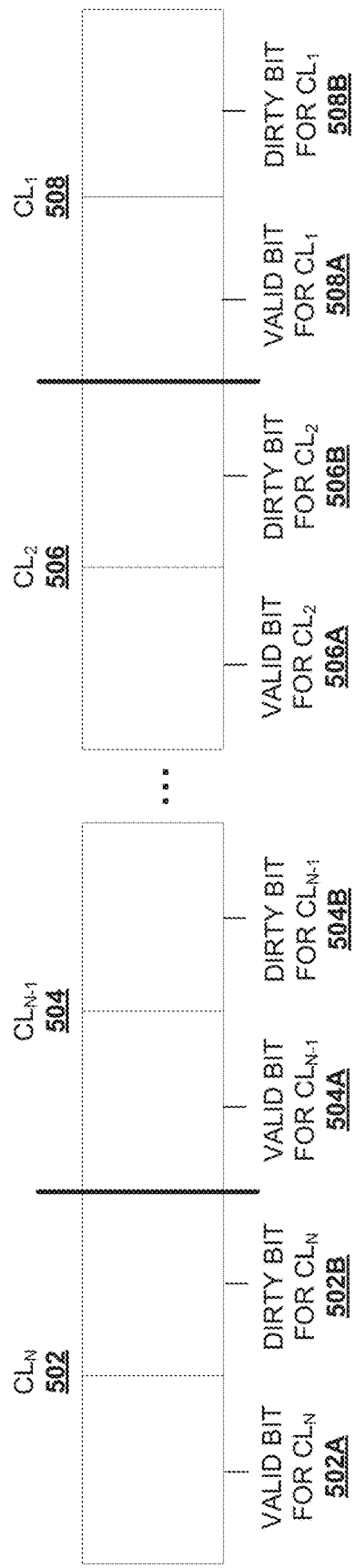
FIG. 5 illustrates an example flag table with valid and write (dirty) bits for a set of cache lines of a cache memory device, in a disclosed embodiment.

Turning now to FIG. 5, illustrated is a non-limiting example of a two-bit status indicator 500 for N cache lines, where N is a suitable integer larger than one. Two-bit status indicator 500 includes two bits for a set of N cache lines, including cache line$_1$ 508, cache line$_2$ 506, through cache line$_{N-1}$ 504 and cache line$_N$ 502 (referred to collectively as cache lines 502-508). Each cache line 502-508 comprises an associated valid bit and dirty bit. For instance, cache line$_1$ 508 includes a valid bit for cache line$_1$ 508A and a dirty bit for cache line$_1$ 508B, and so on, up through a valid bit for cache line$_N$ 502A and a dirty bit for cache line$_N$ 502B (referred to collectively as valid bits 502A-508A, dirty bits 502B-502B, or bits 502A,B-508A,B, in total). When a valid bit and a dirty bit for a cache line are both zero, that cache line has not been updated with data from an associated page of storage memory, nor updated with new data from a host (dirty data) awaiting writing to the storage memory. A set dirty bit indicates new host data is stored at the cache line and needs to be flushed from cache to storage. A set valid bit indicates the cache line holds the same data as is saved at an associated portion of a page of storage. Likewise, a set valid bit and a set dirty bit indicates that data has been read from storage into a cache line, and the cache line has been updated with new host data that is awaiting writing to the page of storage.

FIGS. 6 and 6A depict an example cache management process 600 for a physical page of memory associated with four cache lines. Particularly, the cache lines include cache line$_1$ 608, cache line$_2$ 606, cache line$_3$ 604 and cache line$_4$ 602 (referred to collectively as cache lines 602-608). Two bit flags and their respective data values for cache lines 602-608 are depicted. At power up 610 for cache lines 602-608, all the bits in the cache lines are set to zero and the tag is free. A cache read 620 for cache line$_1$ 608 is performed, which turns out to be a cache miss. As a result of the cache miss to cache line$_1$, the associated page of storage is read and all cache lines are updated with associated portions of stored data from the page of storage. As a result, respective valid bits for each of cache lines 602-608 are set in conjunction with cache read 620. Subsequently, a second cache read 630 to cache line$_3$ 604 is performed, which results in a cache hit since the valid bit for cache line$_3$ is set, and data stored by cache line$_3$ is output to a host device. No changes to the flags are made in response to a read hit.

Turning now to FIG. 6A, example cache management process 600 is continued. A cache write 640 is issued to cache line$_2$ 606, which results in new write data being overwritten to cache line$_2$ 606 and the dirty flag associated with cache line$_2$ being set (e.g., changed from zero to one). A second cache write 650 to cache line$_4$ 602 is received, and additional new write data is overwritten to cache line$_4$ 602. Subsequently, a dirty bit associated with cache line 4 flag is set to dirty (e.g., one). A cache management algorithm then implements a flush page 660 operation in response to the fact that one or more dirty bits of cache lines 602-608 are set. The flush page 600 operation causes data from cache lines 602-608 to be written to the associated physical page of storage memory. Subsequently, all dirty bits are reset (e.g., erased to a zero), while the valid bits are optionally maintained at a one (e.g., set), because each of cache lines 602-608 has data matching respective portions of the physical page of storage memory.

In another aspect, flush page 660 operation can be implemented when cache lines 602-608 are to be modified or replaced by new content and some of the dirty bits are set indicating that data in cache needs to be flushed to storage memory prior to eviction of data in cache lines 602-608. Eviction can be set by a write policy of cache manager 310, and can include, e.g., eviction of a tag assigning cache lines 602-608 to a physical page of memory, a read miss at one of cache lines 602-608 requiring a read from storage memory, an eviction command from a host, a reduction in memory operations received at L4 cache 150 (e.g., opening up clock cycles for eviction), or other need for replacement of data in cache lines 602-608 or reassignment of the tag to another physical page(s) of memory, for instance. In another aspect, since the entire page is valid, the controller may write all the cache lines to storage, or just the updated cache line$_4$ 602 and cache line$_2$ 606. As mentioned, the controller may change the flag bits to maintain the valid bits as being set, and change the dirty bits for CL$_4$ 602 and CL$_2$ 606 to being unset, indicating that there are no new data waiting to be written to storage memory at these cache lines. The change in flag bits can be used to enter a new tag entry as well as be used as a read cache. In yet another aspect, the controller can reset the valid bits as well as the dirty bits following the page flush 660 operation, indicating that the tag entry is free.

Figure 7:
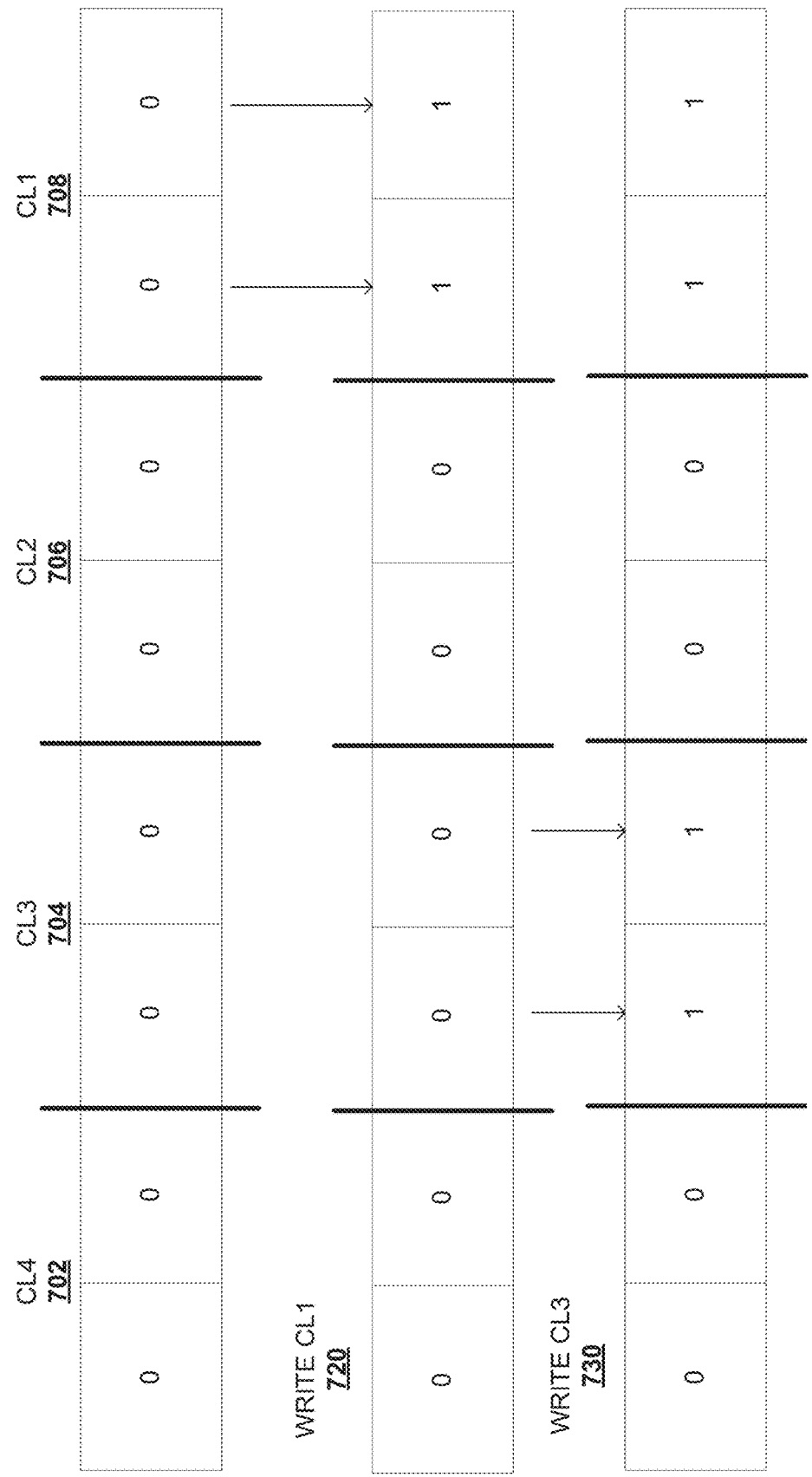

Turning now to FIGS. 7 and 7A, illustrated is an additional non-limiting example of an example cache management operation 700 for a four cache line per physical page of memory storage embodiment. Illustrated are cache line$_4$ 702, cache line$_3$ 704, cache line$_2$ 706, and cache line$_1$ 708 (referred to collectively as cache lines 702-708). At power up 710 all valid and dirty bits for cache lines 702-708 are set to zero and the tag is free. A write operation 720 to write cache line$_1$ 708 is received, and upon determining a write miss, the example cache management 700 proceeds to assign a tag entry for cache lines 702-708 for the write operation. Host data provided with the write operation 720 is saved to cache line$_1$ 708, and the valid and dirty bits for cache line$_1$ 708 are set. A second cache write 730 to cache line$_3$ 704 is received, and a write hit occurs. As such, the flag corresponding to cache line$_3$ 704 is set to valid and dirty data. If this entry is a candidate for eviction, then the controller can first flush the data to the resistive storage DIMM 160. In an embodiment, the data can be flushed with mask bits of 1010, masking writes for cache line$_4$ 702 and cache line$_2$ 706, and permitting writes for cache line$_3$ 704 and cache line$_1$ 708 (e.g., see FIG. 8, infra). Following the (optionally masked) write to storage memory, the flags can then changed to reset the dirty bits for cache line$_1$ 708 and cache line$_3$ 704. Also, since there are no dirty bits set, this entry is a candidate for eviction. The entry can be used for a read cache until the eviction occurs.

Turning now to FIG. 7A, an embodiment for example cache management 700 is illustrated where cache lines 702-708 are not evicted following the second cache write 730. Accordingly, the current state of the flags are: valid and dirty bits for cache line$_4$ 702 are unset, bits for cache line$_3$ 704 are both set, bits for cache line$_2$ 706 are both unset and valid and dirty bits for cache line$_1$ 708 are both set. A read 740 to cache line$_3$ 704 is received, which occurs in a read hit. There are no changes to the flags in response to the read hit, which maintains the current state of the flags Subsequently, a second read 750 to cache line$_4$ 702 is received, which results in a read miss. In an embodiment, a selective read (e.g., a masked read) from portions of physical storage memory corresponding to cache line$_4$ 702 and cache line$_2$ 706 can be implemented, and data stored at the portions of physical storage can be loaded into these two cache lines. Stated differently, only the cache lines that are not dirty are updated with data read from the resistive switching memory 170. In this embodiment, the selective read can import data from storage without having to flush dirty data from cache line$_3$ 704 and cache line$_1$ 708 into storage memory first. Following the selective read, valid bits for cache line$_4$ 702 and cache line$_2$ 706 are set, and bits corresponding to cache line$_3$ 704 and cache line$_1$ 708 are maintained valid and dirty.

Figure 8:
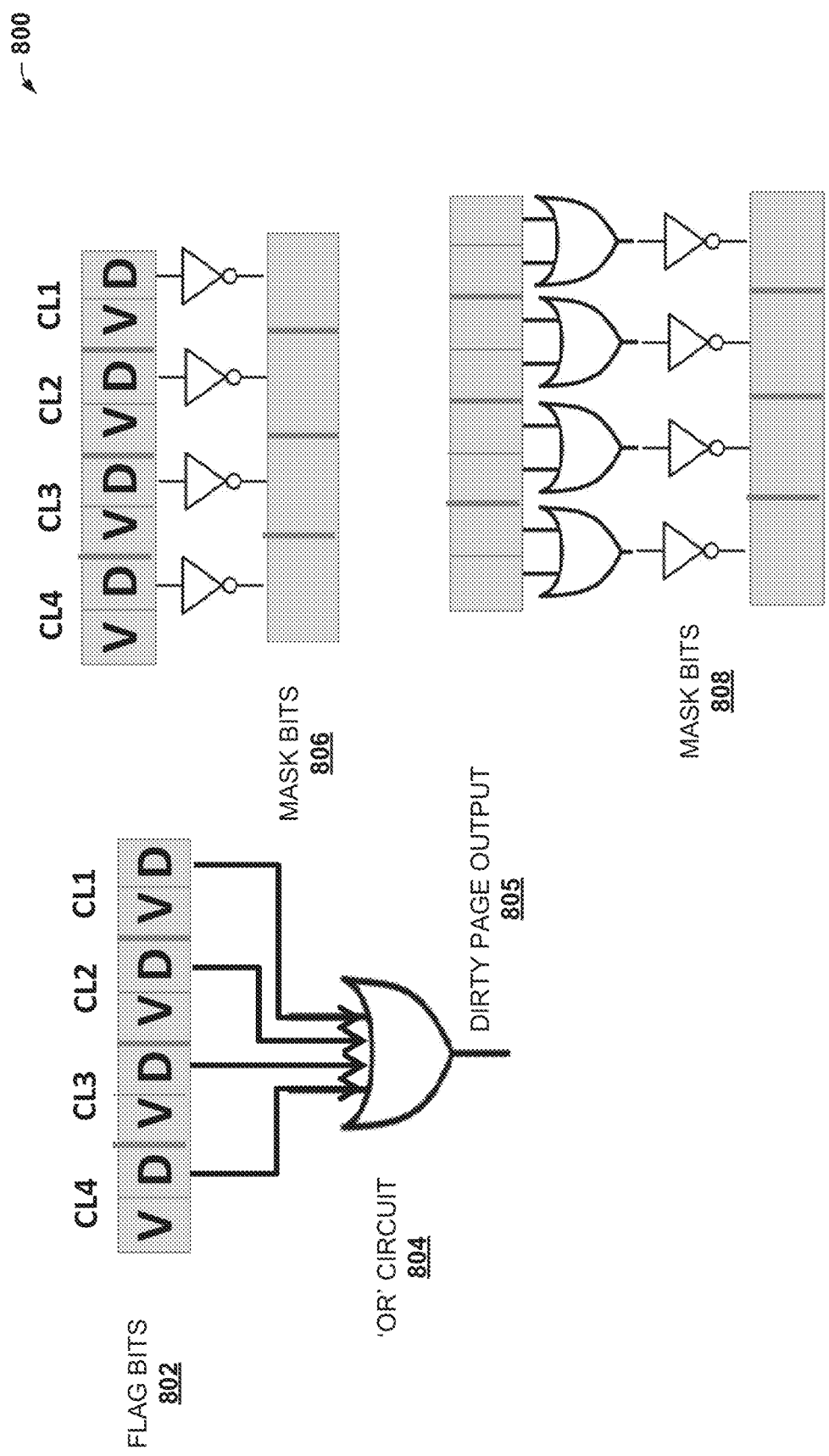
FIG. 8 illustrates schematic diagrams of example circuitry for aggregating cache write status and providing masked bits for writing to storage.

Referring to FIG. 8, there is illustrated example circuits 800 of mask bits for cache operations, according to one or more additional embodiments of the present disclosure. In general, when a cache line(s) is dirty, that cache line(s) has to be flushed prior to eviction of that entry. In an aspect, a controller can send mask bits, such as mask bits 806 or mask bits 808, to resistive switching memory 170 for segments of a physical page associated with cache lines that have no write data to send to storage (or that do not need to load data from storage, in the event of a read miss). In an embodiment, the mask bits can be configured to allow the reordering of a sequence of bits for transfer. In another aspect, cache line flags 802 that have one or more dirty bits can be connected to logical 'OR' circuitry 804 to generate a dirty page output 805 in response to any of the dirty flag bits being set. The dirty page output 805 informs a cache manager that data stored in one or more cache lines must be flushed to storage before eviction of the cache lines. Mask bits 806 or 808 can be set to match the dirty bit values, in an embodiment, such that non dirty cache lines are masked from writing (or reading) from storage and dirty cache lines are permitted to write (or read) from storage.

Thus, disclosed circuits 800 can facilitate a cache line mapping architecture. The resistive switching memory 170 page(s) is tagged to multiple smaller cache lines of a cache block. The circuits 800 allow for the movement of entire pages into a cache in anticipation of receiving a hit on the next cache line feed, or the movement of a single cache line, or variations in between. Thus the mask bit circuits 800 provide one example that enables the cache to interact with resistive switching memory 170 at the sub-page level granularity, writing from one or more cache lines to respective segments of a physical page of storage with a single cache write, or reading from associated segments of the physical page into the one or more cache lines. Furthermore, the architecture includes a flagging mechanism (e.g., dirty bits) to determine which cache lines have been written to and which have not been written to within a page. Therefore, the flagging mechanism indicates valid data and invalid data upon the occurrence of a tag hit.

The aforementioned diagrams have been described with respect to interaction between several components of an electronic device, a processor, a memory controller, a cache management unit, cache memory or resistive switching storage memory. It should be appreciated that in some suitable alternative aspects of the subject disclosure, such diagrams can include those components, controllers, memory units, architectures, etc., specified therein, some of the specified components/controllers/memories, or additional components/controllers/memories. Sub-components can also be implemented as connected to other sub-components rather than included within a parent component. For example, multiple cache or storage memory banks can be provided on separate memory chips, instead of on a single chip. Additionally, it is noted that one or more disclosed processes can be combined into a single process providing aggregate functionality. Components of the disclosed devices/architectures can also interact with one or more other components not specifically described herein but known by those of skill in the art.

In view of the exemplary diagrams described supra, process methods that can be implemented in accordance with the disclosed subject matter will be better appreciated with reference to the flow charts of FIGS. 9-13. While for purposes of simplicity of explanation, the methods of FIGS. 9-13 are shown and described as a series of blocks, it is to be understood and appreciated that the claimed subject matter is not limited by the order of the blocks, as some blocks may occur in different orders or concurrently with other blocks from what is depicted and described herein. Moreover, not all illustrated blocks are necessarily required to implement the methods described herein. Additionally, it should be further appreciated that some or all of the methods disclosed throughout this specification are capable of being stored on an article of manufacture to facilitate transporting and transferring such methodologies to an electronic device. The term article of manufacture, as used, is intended to encompass a computer program accessible from any computer-readable device, device in conjunction with a carrier, or storage medium.

Figure 9:
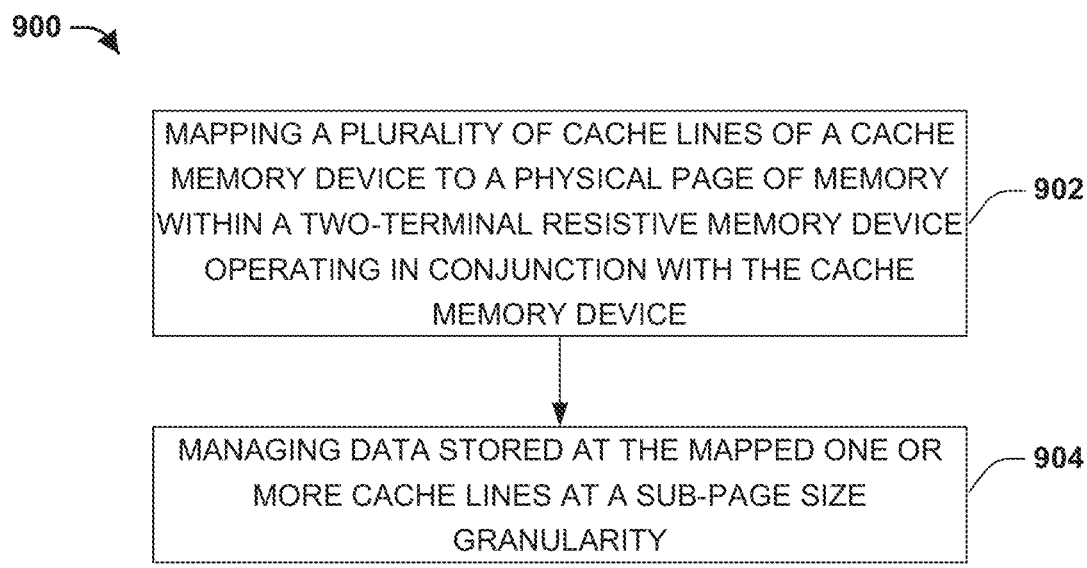
FIG. 9 illustrates a flowchart of an example method for mapping a cache line to a physical page of memory in accordance with a disclosed embodiment.

FIG. 9 provides an example method 900 for mapping cache lines to physical pages of a memory. At 900, one or more cache lines of a cache memory are mapped to a physical page of storage memory within a non-volatile, two-terminal resistive memory device. In an embodiment, the mapping of the one or more cache lines to the physical page of storage memory can be represented by a tag stored in a tag table by a cache controller unit (e.g., cache manager 310 of FIG. 3, supra, L4 cache manager 140 of FIGS. 1 and 2, supra, or the like). In some embodiments, the one or more cache lines can be mapped to multiple physical pages of memory, and the mapping can be represented by the tag stored in the tag table. At 904, method 900 can comprise managing data stored at the one or more cache lines at a page size granularity. In some embodiments, management of the data stored at the one or more cache lines can be facilitated by maintaining a flag table storing one or more bits of status data pertaining to the one or more cache lines, or pertaining to each cache line. In one embodiment, a two-bit status indicator comprising respective valid bits and dirty bits can be maintained with each cache line of the one or more cache lines. In another embodiment, a one-bit status indicator comprising dirty bits for each cache line of the one or more cache lines can be maintained at the flag table. In still other embodiments, a one-bit status indicator comprising a single dirty bit for the one or more cache lines can be maintained at the flag table.

Figure 10:
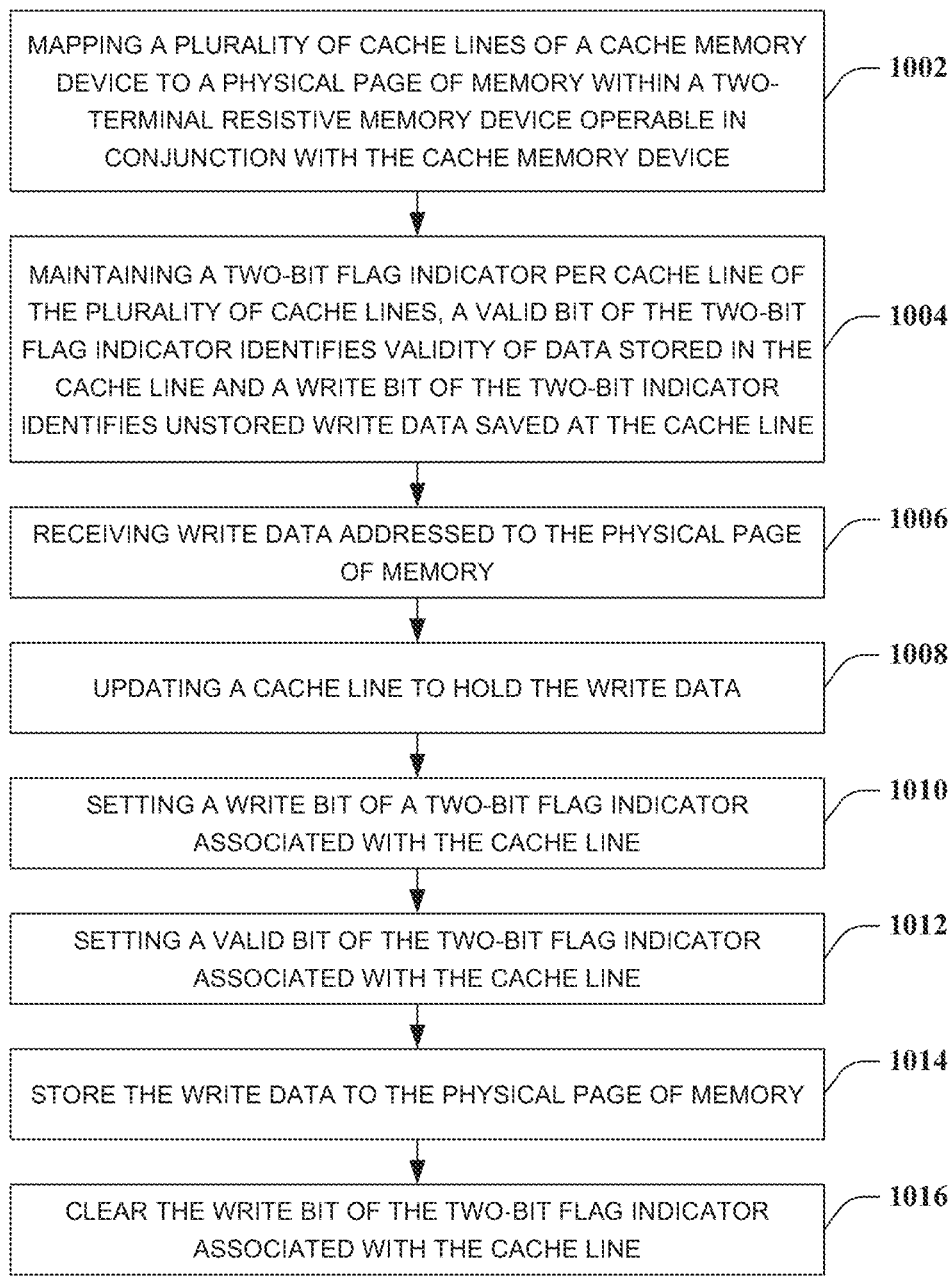
FIG. 10 depicts a flowchart of a sample method for managing cache memory for memory operations involving resistive switching storage memory.

FIG. 10 provides an example method 1000 for mapping cache lines to physical pages of a memory in alternative or additional aspects of the present disclosure. At 1002, method 1000 can comprise mapping a plurality of cache lines of a cache memory to one or more physical pages of storage memory within a non-volatile, two-terminal resistive storage memory. Association of the plurality of cache lines to the one or more physical pages of storage memory can be maintained by a suitable tag stored at a tag table for the cache memory and the non-volatile, two-terminal resistive storage memory, in an embodiment. At 1006, method 1000 can comprise receiving a write command and write data addressed to a physical page of the one or more physical pages of storage memory. At 1008, method 1000 can comprise updating a cache line of the plurality of cache lines to hold the write data, in response to determining a write miss at the cache memory. At 1010, method 1000 can comprise setting a write bit (also referred to herein as a dirty bit) of a two-bit flag indicator associated with the cache line. At 1012, method 1000 can comprise setting a valid bit of the two-bit flag indicator associated with the cache line. At 1014, method 1000 can comprise initiating a cache flush operation for the plurality of cache lines, and storing the write data to a segment of the one or more physical pages of memory associated with the cache line. At 1016, method 1000 can comprise clearing the write bit of the two-bit flag indicator associated with the cache line.

Figure 11:
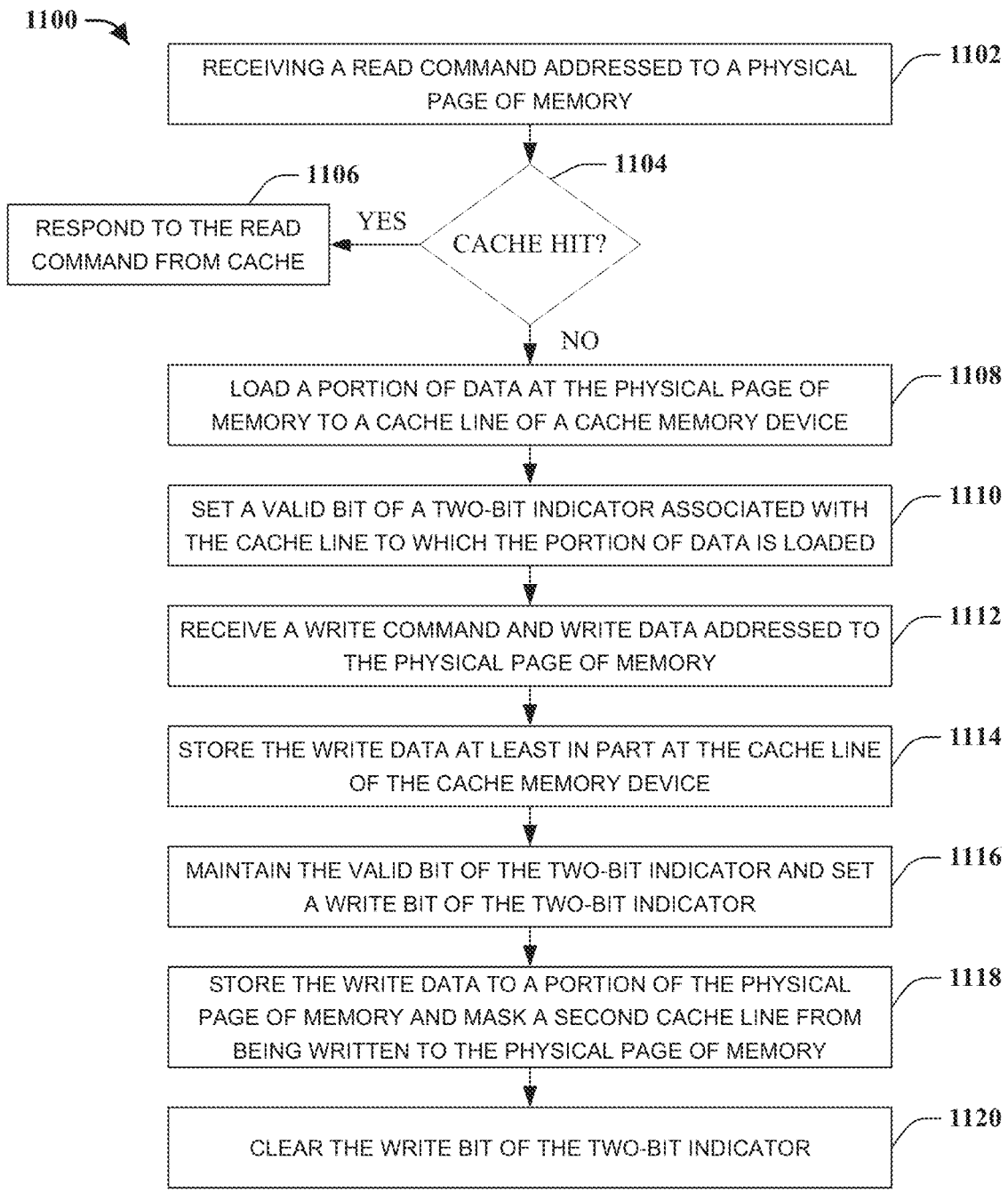
FIG. 11 depicts a flowchart of a sample method for managing cache memory in conjunction with resistive switching storage memory in a further embodiment.

FIG. 11 illustrates a flowchart of an example method 1100 for operating a cache memory in conjunction with a non-volatile, resistive switching memory device, according to further embodiments. At 1102, method 1100 can comprise receiving a read command addressed to a physical page of non-volatile memory. At 1104, a determination is made as to whether the read command is a cache read hit in a corresponding volatile cache memory associated with the non-volatile memory. In response to determining the cache read hit, method 1100 can proceed to 1106 and respond to the read command with data stored in the cache memory. In response to determining a cache read miss, method 1100 can proceed to 1108, and can comprise loading a portion of data at the physical page of memory to a cache line of the cache memory. In an embodiment, all data stored at the physical page of memory can be loaded into a plurality of cache lines associated with the physical page of memory in response to the cache read miss. In an alternative embodiment, one or more mask bits can be utilized to selectively read a subset(s) of data stored at one or more segments of the physical page of memory that correspond to the cache line (or a subset of the plurality of cache lines). In a further embodiment, the one or more mask bits can correspond to unset dirty bits associated with the plurality of cache lines, thereby masking of transfer between the cache lines having unset dirty bits, and allowing transfer of data between cache lines having set dirty bits. Following loading data to the cache line of the cache memory, method 1100 at 1110 can comprise setting a valid bit of a two-bit indicator associated with the cache line to which the portion of data is loaded.

In addition to the foregoing, at 1112, method 1100 can comprise receiving a write command and write data addressed to the physical page of memory. At 1114, method 1100 can comprise storing the write data at least in part at the cache line of the cache memory device. At 1116, method 1100 can comprise maintaining the valid bit of the two-bit indicator and setting a write bit of the two-bit indicator. At 1118, method 1100 can comprise storing the write data to a portion of the physical page of memory and making a second cache line from being written to the physical page of memory. At 1120, method 1100 can comprise clearing the write bit of the two-bit indicator.

Figure 12:
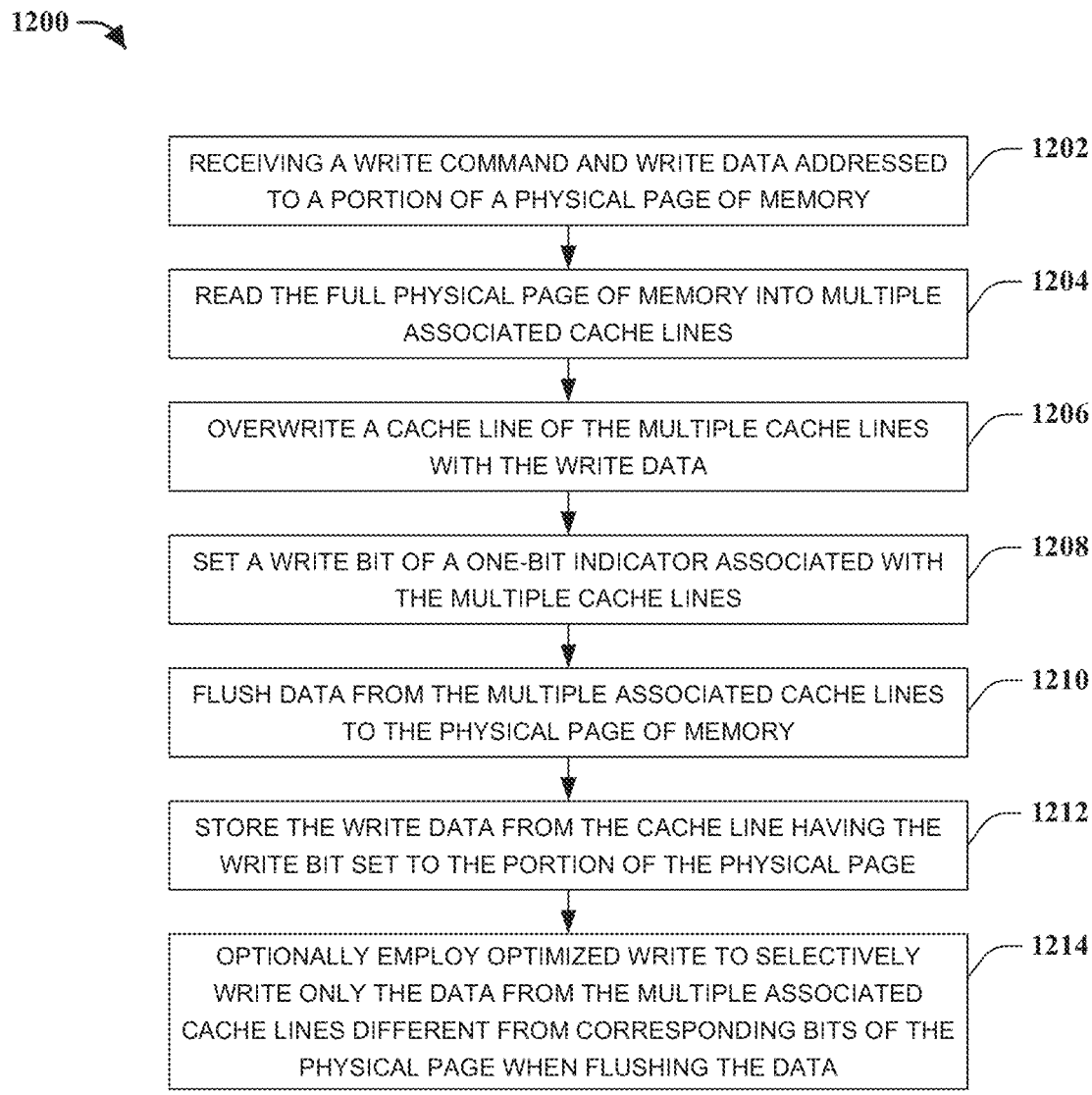
FIG. 12 illustrates a flowchart of an example method for auto-validating cache memory in conjunction with a cache write miss, in an alternative embodiment.

FIG. 12 depicts a flowchart of a sample method 1200 for managing cache memory in conjunction with an auto-validate process for cache lines of the cache memory, according to still further embodiments of the present disclosure. At 1202, method 1200 can comprise receiving a write command and write data addressed to a portion of a physical page of memory. At 1204, method 1200 can comprise reading the full physical page of memory into multiple cache lines associated with the full physical page of memory. At 1206, method 1200 can comprise overwriting a cache line of the multiple cache lines with the write data. At 1208, method 1200 can comprise setting a write bit of a one-bit indicator associated with the multiple cache lines, indicating the multiple cache lines comprise dirty data. At 1210, method 1200 can comprise flushing data from the multiple associated cache lines to the physical page of memory and, at 1212, method 1200 can comprise storing the write data from the cache line having the write bit set to the portion of the physical page of memory. At 1214, method 1200 can optionally comprise implementing an optimized write algorithm at the physical memory to selectively modify bits of the physical page updated by the write data, and not modify bits of the physical page identical to the multiple associated cache lines.

Figure 13:
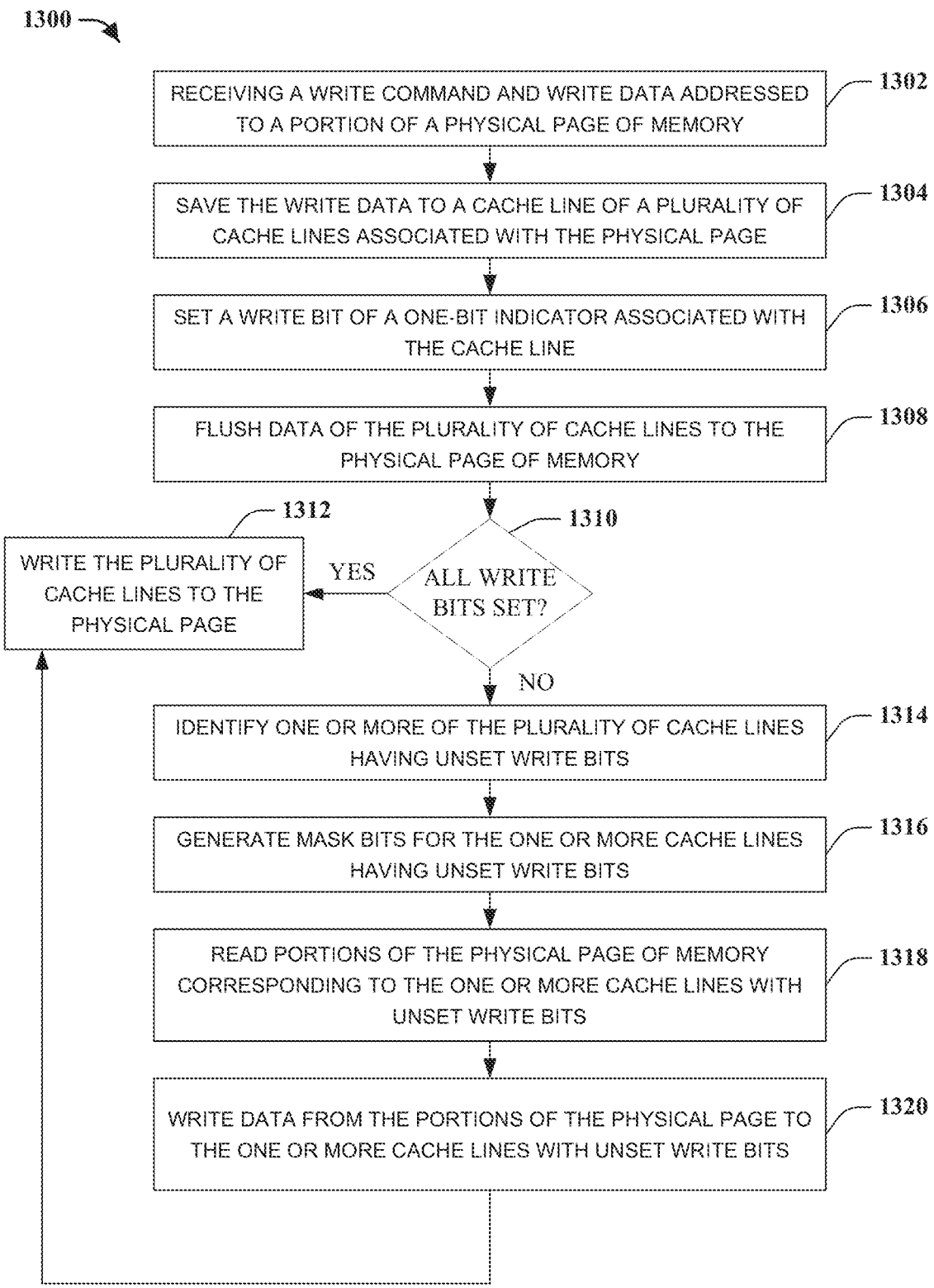
FIG. 13 depicts a flowchart of a sample method for conditional auto-validation of cache memory in conjunction with flushing cache memory to storage.

FIG. 13 depicts a flowchart of a sample method 1300 for managing cache memory in conjunction with a conditional auto-validate process for cache lines of the cache memory, in further embodiments. At 1302, method 1300 can comprise receiving a write command and write data addressed to a portion of a physical page of memory. At 1304, method 1300 can comprise saving the write data to a cache line of a plurality of cache lines associated with the physical page. At 1306, method 1300 can comprise setting a write bit of a one-bit indicator associated with the cache line. At 1308, method 1300 can comprise flushing data of the plurality of cache lines to the physical page of memory, and at 1310 a determination is made as to whether all write bits corresponding to each cache line of the plurality of cache lines are set. If all write bits are set, method 1300 can proceed to 1312 and write the plurality of cache lines to the physical page of memory, and reset all of the write bits of the plurality of cache lines. If one or more of the write bits are unset, method 1300 can proceed to 1314 and identify one or more of the plurality of cache lines having unset write bits. Further, at 1316, method 1300 can comprise generating mask bits for the one or more cache lines having unset write bits and providing the mask bits to the physical page of memory. At 1318, method 1300 can comprise reading associated portions of the physical page of memory corresponding to the one or more cache lines with unset write bits. At 1320, method 1300 can comprise writing the data read from the portions of the physical page of memory to the associated cache lines of the plurality of cache lines. Method 1300 can then proceed to 1312 and can comprise writing the plurality of cache lines to the physical page of memory, optionally employing an optimized write algorithm at the physical memory to selectively modify bits of the physical page updated by the write data, and not modify bits of the physical page identical to the plurality of cache lines.

Example Embodiments

Figure 14:
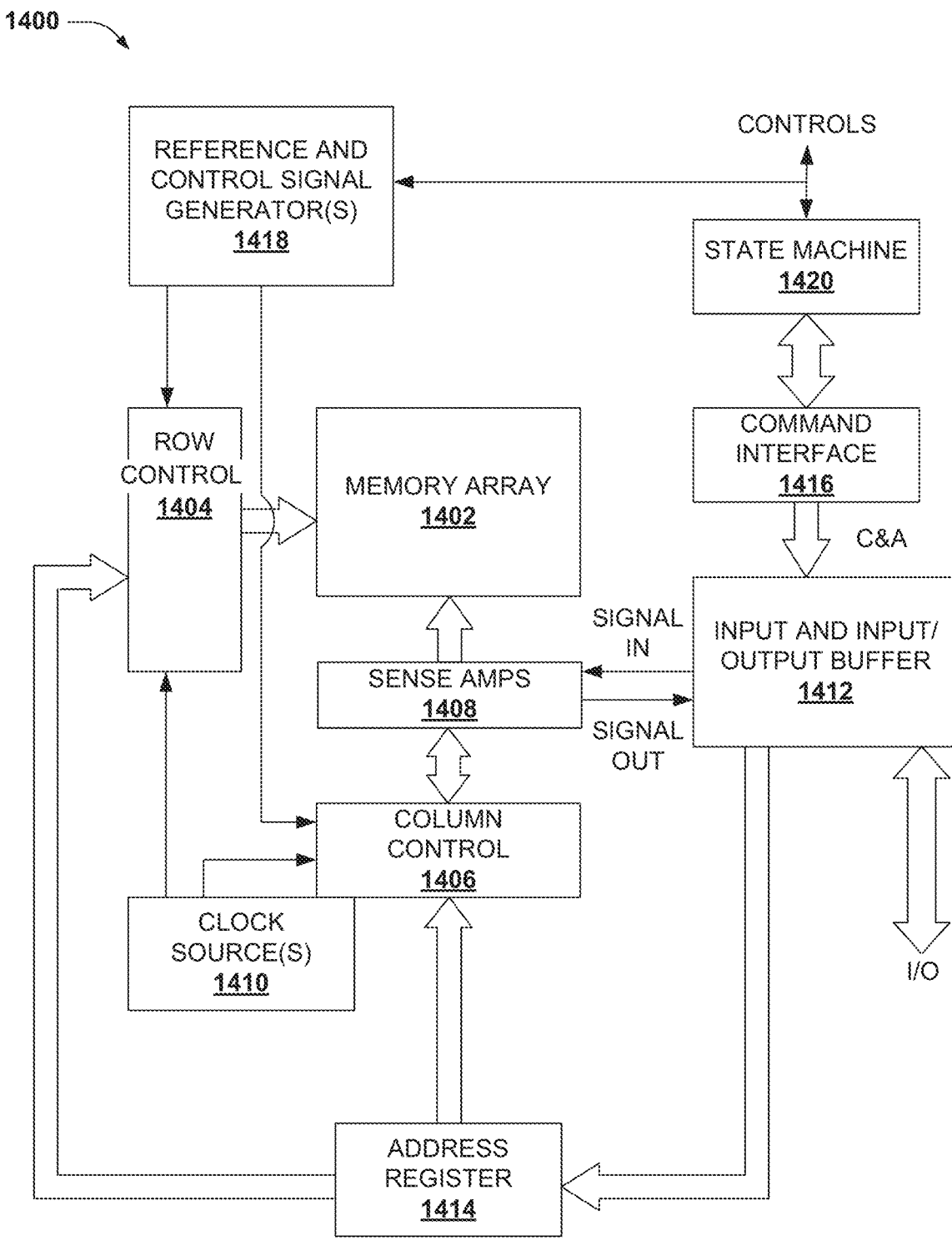
FIG. 14 illustrates a block diagram of an example electronic operating environment in accordance with certain embodiments of this disclosure.
Figure 15:
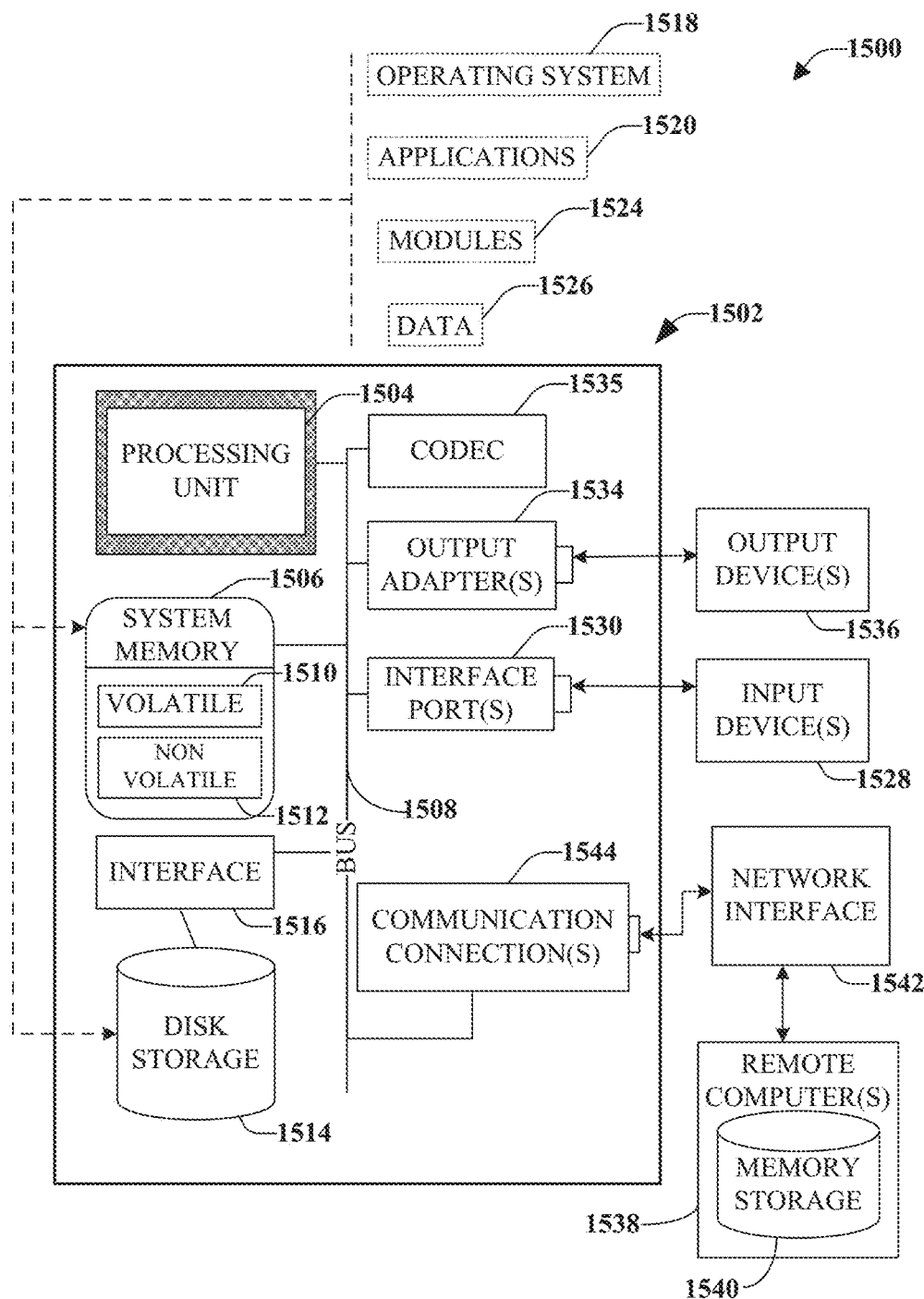
FIG. 15 illustrates a block diagram of an example computing environment in accordance with certain embodiments of this disclosure.

In order to provide a context for the various aspects of the disclosed subject matter, FIGS. 14 and 15, as well as the following discussion, are intended to provide a brief, general description of a suitable environment in which various aspects of the disclosed subject matter can be implemented or processed. While the subject matter has been described above in the general context of electronic memory or architectures and process methodologies for operating such memory or architectures, those skilled in the art will recognize that the subject disclosure also can be implemented in combination with other architectures or process methodologies. Moreover, those skilled in the art will appreciate that the disclosed processes can be practiced with a processing system or a computer processor, either alone or in conjunction with a host computer (e.g., computer 1502 of FIG. 15, infra), which can include single-processor or multiprocessor computer systems, mini-computing devices, mainframe computers, as well as personal computers, hand-held computing devices (e.g., PDA, smart phone, watch), microprocessor-based or programmable consumer or industrial electronics, and the like. The illustrated aspects may also be practiced in distributed computing environments where tasks are performed by remote processing devices that are linked through a communications network. However, some, if not all aspects of the subject innovation can be practiced on stand-alone electronic devices, such as a memory card, Flash memory module, removable memory, or the like. In a distributed computing environment, program modules can be located in both local and remote memory storage modules or devices.

In various embodiments of the subject disclosure, disclosed memory architectures can be employed as a stand-alone or integrated embedded memory device with a CPU or microcomputer. Some embodiments can be implemented, for instance, as part of a computer memory (e.g., random access memory, cache memory, read-only memory, storage memory, or the like). Other embodiments can be implemented, for instance, as a portable memory device. Examples of suitable portable memory devices can include removable memory, such as a secure digital (SD) card, a universal serial bus (USB) memory stick, a compact flash (CF) card, or the like, or suitable combinations of the foregoing.

NAND FLASH is employed for compact FLASH devices, USB devices, SD cards, solid state drives (SSDs), and storage class memory, as well as other form-factors. Although NAND has proven a successful technology in fueling the drive to scale down to smaller devices and higher chip densities over the past decade, as technology scaled down past 25 nanometer (nm) memory cell technology, several structural, performance, and reliability problems became evident. Such considerations have been addressed by the disclosed aspects.

FIG. 14 illustrates a block diagram of an example operating and control environment 1400 for a memory bank 1402 of a multi-bank memory cell array according to aspects of the subject disclosure. In at least one aspect of the subject disclosure, memory bank 1402 can comprise memory selected from a variety of memory cell technologies. In at least one embodiment, memory bank 1402 can comprise a two-terminal memory technology, arranged in a compact two or three dimensional architecture. In at least one embodiment, memory bank 1402 can be implemented in a dual-inline memory module (DIMM) in conjunction with a cache memory, or with the cache memory residing on a separate DIMM, as described herein. Suitable two-terminal memory technologies can include resistive-switching memory, conductive-bridging memory, phase-change memory, organic memory, magneto-resistive memory, or the like, or a suitable combination of the foregoing. In an embodiment, memory bank 1402 can be configured to operate according to a first set of configurations (e.g., MLC, SLC, operation voltage, clock speed, latency, etc.) that is at least in part different from a second set of configurations of a second memory bank of the multi-bank array of memory.

A column controller 1406 and sense amps 1408 can be formed adjacent to memory bank 1402. Moreover, column controller 1406 can be configured to activate (or identify for activation) a subset of bitlines of memory bank 1402. Column controller 1406 can utilize a control signal provided by a reference and control signal generator(s) 1418 to activate, as well as operate upon, respective ones of the subset of bitlines, applying suitable program, erase or read voltages to those bitlines. Non-activated bitlines can be kept at an inhibit voltage (also applied by reference and control signal generator(s) 1418), to mitigate or avoid bit-disturb effects on these non-activated bitlines.

In addition, operating and control environment 1400 can comprise a row controller 1404. Row controller 1404 can be formed adjacent to and electrically connected with word lines of memory bank 1402. Further, utilizing control signals of reference and control signal generator(s) 1418, row controller 1404 can select particular rows of memory cells with a suitable selection voltage. Moreover, row controller 1404 can facilitate program, erase or read operations by applying suitable voltages at selected word lines.

Sense amps 1408 can read data from, or write data to the activated memory cells of memory bank 1402, which are selected by column control 1406 and row control 1404. Data read out from memory bank 1402 can be provided to an input and input/output buffer 1412 (e.g., a DDR buffer, an LPDDR buffer, a non-standard buffer, or the like, in some embodiments) Likewise, data to be written to memory bank 1402 can be received from the input and input/output buffer 1412 and written to the activated memory cells of memory bank 1402.

A clock source(s) 1410 can provide respective clock pulses to facilitate timing for read, write, and program operations of row controller 1404 and column controller 1406. Clock source(s) 1410 can further facilitate selection of wordlines or bitlines in response to external or internal commands received by operating and control environment 1400. Input and input/output buffer 1412 can comprise a command and address input, as well as a bidirectional data input and output. Instructions are provided over the command and address input, and the data to be written to memory bank 1402 as well as data read from memory bank 1402 is conveyed on the bidirectional data input and output, facilitating connection to an external host apparatus, such as a computer or other processing device (not depicted, but see e.g., computer 1502 of FIG. 15, infra).

Input and input/output buffer 1412 can be configured to receive write data, receive an erase instruction, receive a status or maintenance instruction, output readout data, output status information, and receive address data and command data, as well as address data for respective instructions. Address data can be transferred to row controller 1404 and column controller 1406 by an address register 1410. In addition, input data is transmitted to memory bank 1402 via signal input lines between sense amps 1408 and input and input/output buffer 1412, and output data is received from memory bank 1402 via signal output lines from sense amps 1408 to input and input/output buffer 1412. Input data can be received from the host apparatus, and output data can be delivered to the host apparatus via the I/O bus.

Commands received from the host apparatus can be provided to a command interface 1416. Command interface 1416 can be configured to receive external control signals from the host apparatus, and determine whether data input to the input and input/output buffer 1412 is write data, a command, or an address. Input commands can be transferred to a state machine 1420.

State machine 1420 can be configured to manage programming and reprogramming of memory bank 1402 (as well as other memory banks of the multi-bank memory array). Instructions provided to state machine 1420 are implemented according to control logic configurations, enabling state machine 1420 to manage read, write, erase, data input, data output, and other functionality associated with memory bank 1402. In some aspects, state machine 1420 can send and receive acknowledgments and negative acknowledgments regarding successful receipt or execution of various commands. In further embodiments, state machine 1420 can decode and implement status-related commands, decode and implement configuration commands, and so on.

To implement read, write, erase, input, output, etc., functionality, state machine 1420 can control clock source(s) 1408 or reference and control signal generator(s) 1418. Control of clock source(s) 1408 can cause output pulses configured to facilitate row controller 1404 and column controller 1406 implementing the particular functionality. Output pulses can be transferred to selected bitlines by column controller 1406, for instance, or wordlines by row controller 1404, for instance.

In connection with FIG. 15, the systems and processes described below can be embodied within hardware, such as a single integrated circuit (IC) chip, multiple ICs, an application specific integrated circuit (ASIC), or the like. Further, the order in which some or all of the process blocks appear in each process should not be deemed limiting. Rather, it should be understood that some of the process blocks can be executed in a variety of orders, not all of which may be explicitly illustrated herein.

With reference to FIG. 15, a suitable environment 1500 for implementing various aspects of the claimed subject matter includes a computer 1502. The computer 1502 includes a processing unit 1504, a system memory 1506, a codec 1535, and a system bus 1508. The system bus 1508 couples system components including, but not limited to, the system memory 1506 to the processing unit 1504. The processing unit 1504 can be any of various available processors. Dual microprocessors and other multiprocessor architectures also can be employed as the processing unit 1504.

The system bus 1508 can be any of several types of bus structure(s) including the memory bus or memory controller, a peripheral bus or external bus, or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 1506 includes volatile memory 1510 and non-volatile memory 1512, which can employ one or more of the disclosed memory architectures, in various embodiments. The basic input/output system (BIOS), containing the basic routines to transfer information between elements within the computer 1502, such as during start-up, is stored in non-volatile memory 1512. In addition, according to present innovations, codec 1535 may include at least one of an encoder or decoder, wherein the at least one of an encoder or decoder may consist of hardware, software, or a combination of hardware and software. Although, codec 1535 is depicted as a separate component, codec 1535 may be contained within non-volatile memory 1512. By way of illustration, and not limitation, non-volatile memory 1512 can include read only memory (ROM), programmable ROM (PROM), electrically programmable ROM (EPROM), electrically erasable programmable ROM (EEPROM), or Flash memory. Non-volatile memory 1512 can employ one or more of the disclosed memory devices, in at least some embodiments. Moreover, non-volatile memory 1512 can be computer memory (e.g., physically integrated with computer 1502 or a mainboard thereof), or removable memory. Examples of suitable removable memory with which disclosed embodiments can be implemented can include a secure digital (SD) card, a compact Flash (CF) card, a universal serial bus (USB) memory stick, or the like. Volatile memory 1510 includes random access memory (RAM), which acts as external cache memory, and can also employ one or more disclosed memory devices in various embodiments. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ESDRAM) and so forth.

Computer 1502 may also include removable/non-removable, volatile/non-volatile computer storage medium. FIG. 15 illustrates, for example, disk storage 1514. Disk storage 1514 includes, but is not limited to, devices like a magnetic disk drive, solid state disk (SSD) floppy disk drive, tape drive, Jaz drive, Zip drive, LS-100 drive, flash memory card, or memory stick. In addition, disk storage 1514 can include storage medium separately or in combination with other storage medium including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1514 to the system bus 1508, a removable or non-removable interface is typically used, such as interface 1516. It is appreciated that storage devices 1514 can store information related to a user. Such information might be stored at or provided to a server or to an application running on a user device. In one embodiment, the user can be notified (e.g., by way of output devices) 1536) of the types of information that are stored to disk storage 1514 or transmitted to the server or application. The user can be provided the opportunity to opt-in or opt-out of having such information collected or shared with the server or application (e.g., by way of input from input device(s) 1528).

It is to be appreciated that FIG. 15 describes software that acts as an intermediary between users and the basic computer resources described in the suitable operating environment 1500. Such software includes an operating system 1518. Operating system 1518, which can be stored on disk storage 1514, acts to control and allocate resources of the computer system 1502. Applications 1520 take advantage of the management of resources by operating system 1518 through program modules 1524, and program data 1526, such as the boot/shutdown transaction table and the like, stored either in system memory 1506 or on disk storage 1514. It is to be appreciated that the claimed subject matter can be implemented with various operating systems or combinations of operating systems.

A user enters commands or information into the computer 1502 through input device(s) 1528. Input devices 1528 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1504 through the system bus 1508 via interface port(s) 1530. Interface port(s) 1530 include, for example, a serial port, a parallel port, a game port, and a universal serial bus (USB). Output device(s) 1536 use some of the same type of ports as input device(s) 1528. Thus, for example, a USB port may be used to provide input to computer 1502 and to output information from computer 1502 to an output device 1536. Output adapter 1534 is provided to illustrate that there are some output devices 1536 like monitors, speakers, and printers, among other output devices 1536, which require special adapters. The output adapters 1534 include, by way of illustration and not limitation, video and sound cards that provide a means of connection between the output device 1536 and the system bus 1508. It should be noted that other devices or systems of devices provide both input and output capabilities such as remote computer(s) 1538.

Computer 1502 can operate in a networked environment using logical connections to one or more remote computers, such as remote computer(s) 1538. The remote computer(s) 1538 can be a personal computer, a server, a router, a network PC, a workstation, a microprocessor based appliance, a peer device, a smart phone, a tablet, or other network node, and typically includes many of the elements described relative to computer 1502. For purposes of brevity, only a memory storage device 1540 is illustrated with remote computer(s) 1538. Remote computer(s) 1538 is logically connected to computer 1502 through a network interface 1542 and then connected via communication connection(s) 1544. Network interface 1542 encompasses wire or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 1544 refers to the hardware/software employed to connect the network interface 1542 to the bus 1508. While communication connection 1544 is shown for illustrative clarity inside computer 1502, it can also be external to computer 1502. The hardware/software necessary for connection to the network interface 1542 includes, for exemplary purposes only, internal and external technologies such as, modems including regular telephone grade modems, cable modems and DSL modems, ISDN adapters, and wired and wireless Ethernet cards, hubs, and routers.

As utilized herein, terms "component," "system," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities.

Unless specifically stated otherwise or apparent from the foregoing discussion, it is appreciated that throughout the disclosed subject matter, discussions utilizing terms such as processing, computing, replicating, mimicking, determining, or transmitting, and the like, refer to the action and processes of processing systems, and/or similar consumer or industrial electronic devices or machines, that manipulate or transform data or signals represented as physical (electrical or electronic) quantities within the circuits, registers or memories of the electronic device(s), into other data or signals similarly represented as physical quantities within the machine or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. A method of caching data stored in a two-terminal resistive memory utilizing a cache memory device that is independent of and off-chip from central processing logic, comprising:
  mapping, based on one or more tags stored in a tag table, a plurality of cache lines of the cache memory device to a physical page of memory within a two-terminal resistive memory device; and
  managing data stored at the mapped plurality of cache lines at a sub-page size granularity relative to a page size of the physical page of the two-terminal resistive memory device.

2. The method of claim 1, further comprising:
  receiving a write command and write data addressed to the physical page of memory; and
  saving the write data at a first cache line of the plurality of cache lines.

3. The method of claim 2, further comprising setting a write bit of a two-bit indicator associated with the first cache line in response to saving the write data at the first cache line.

4. The method of claim 3, further comprising setting a valid bit of the two-bit indicator associated with the first cache line in response to saving the write data at the first cache line.

5. The method of claim 4, further comprising:
  writing the write data from the first cache line to a portion of the physical page of memory; and
  clearing the write bit of the two-bit indicator.

6. The method of claim 5, further comprising masking data from a second cache line of the plurality of cache lines from being written to the physical page of memory, the second cache line being associated with a second write bit of a second two-bit indicator that is not set.

7. The method of claim 1, further comprising:
receiving a read command addressed to a portion of the physical page of memory; and
referencing a valid bit of a two-bit indicator for a cache line of the plurality of cache lines associated with the portion of the physical page of memory.

8. The method of claim 7, further comprising outputting data from the cache line of the plurality of cache lines in response to the valid bit for the cache line being set.

9. The method of claim 7, further comprising:
in response to the valid bit for the cache line being unset, reading data from the physical page of memory into the cache line of the plurality of cache lines;
outputting the data in response to the read command; and
setting the valid bit.

10. The method of claim 1, wherein the cache memory device is a dynamic random access memory, a static random access memory, or a magnetic random access memory, and further wherein the cache memory device and the two-terminal resistive memory device utilize a double data rate (DDR) bus on a single dual-inline memory module (DIMM) for control and data communication with a host device external to the DIMM.

11. The method of claim 1, wherein the cache memory device is located on a first dual-inline memory module and the two-terminal resistive memory device is located on a second dual-inline memory module.

12. A method of caching data stored in a two-terminal resistive memory utilizing a cache memory device that is independent of and off-chip from central processing logic, comprising:
initializing a tag table representing a block of cache memory;
mapping, based on one or more tags stored in the tag table, a plurality of cache lines of the block of cache memory to a physical page of memory within a two-terminal resistive memory device; and
managing data stored at the mapped plurality of cache lines at a sub-page size granularity relative to a page size of the physical page of the two-terminal resistive memory device.

13. The method of claim 12, wherein the managing data stored at the mapped plurality of cache lines further comprises:
initializing a flag table representing status of data stored in the plurality of cache lines of the block of cache memory mapped to the physical page of the two-terminal resistive memory device;
receiving a write command including write data addressed to the physical page of the two-terminal resistive memory device;
updating a cache line of the plurality of cache lines to save the write data, and setting a write bit within the flag table that is associated with the cache line to indicate the cache line holds data more current than a portion of the physical page of the two-terminal resistive memory device that is mapped to the cache line; and
initiating a flush data operation for the plurality of cache lines of the block of cache memory to write data from the plurality of cache lines to the physical page of the two-terminal resistive memory device.

14. The method of claim 13, further comprising, prior to updating the cache line of the plurality of cache lines to save the write data, reading stored data from the physical page of the two-terminal resistive memory device and writing the stored data to the plurality of cache lines mapped to the physical page of the two-terminal resistive memory device.

15. The method of claim 14, wherein updating the cache line of the plurality of cache lines further comprises overwriting, with the write data, a portion of the stored data written to the cache line in conjunction with the writing the stored data to the plurality of cache lines.

16. The method of claim 13, further comprising, in response to initiating the flush data operation and prior to writing the data from the plurality of cache lines to the physical page of the two-terminal resistive memory device, referencing the flag table to identify whether a second write bit associated with a second cache line of the plurality of cache lines is unset.

17. The method of claim 16, further comprising:
reading from the physical page of the two-terminal resistive memory device a portion of stored data corresponding with the second cache line;
saving the portion of stored data into the second cache line in response to determining the second write bit is unset; and subsequently:
writing the data from the plurality of cache lines to the physical page of the two-terminal resistive memory device including the write data and including the portion of stored data.

18. The method of claim 16, further comprising writing the data from the plurality of cache lines to the physical page of the two-terminal resistive memory device in response to determining no write bits associated with the plurality of cache lines are unset.

19. The method of claim 12, wherein the managing data stored at the mapped plurality of cache lines further comprises:
initializing a flag table representing status of data stored in the plurality of cache lines of the block of cache memory mapped to the physical page of the two-terminal resistive memory device;
receiving a read command addressed to the physical page of the two-terminal resistive memory device;
reference the flag table to determine whether data stored in the plurality of cache lines and associated with the read command is valid data; and at least one of:
reading cache data stored at one or more of the plurality of cache lines and responding to the read command with the cache data in response to determining the data stored in the plurality of cache lines and associated with the read command is valid data; or
loading a portion of data at the physical page of the two-terminal resistive memory device to a cache line of the plurality of cache lines and responding to the read command with the portion of data loaded from the physical page of the two-terminal resistive memory device in response to determining the data stored in the plurality of cache lines and associated with the read command is not valid data.

20. The method of claim 19, further comprising setting a valid bit of the flag table that corresponds to the cache line of the plurality of cache lines in response to loading the portion of data at the physical page of the two-terminal resistive memory device to the cache line of the plurality of cache lines.

* * * * *